(12) United States Patent
Dutta et al.

(10) Patent No.: US 9,343,160 B1
(45) Date of Patent: May 17, 2016

(54) ERASE VERIFY IN NON-VOLATILE MEMORY

(71) Applicant: SanDisk Technologies Inc., Plano, TX (US)

(72) Inventors: Deepanshu Dutta, Fremont, CA (US); Shih-Chung Lee, Yokohama (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/619,857

(22) Filed: Feb. 11, 2015

(51) Int. Cl.
*G11C 11/34* (2006.01)
*G11C 16/14* (2006.01)
*G11C 16/04* (2006.01)
*G11C 16/34* (2006.01)
*G11C 16/26* (2006.01)

(52) U.S. Cl.
CPC ............ *G11C 16/14* (2013.01); *G11C 16/0483* (2013.01); *G11C 16/26* (2013.01); *G11C 16/3445* (2013.01)

(58) Field of Classification Search
USPC ............. 365/185.17, 185.18, 185.19, 185.21, 365/185.22, 185.23, 185.24, 185.29, 185.33
See application file for complete search history.

(56) References Cited

U.S. PATENT DOCUMENTS

| | | | |
|---|---|---|---|
| 6,215,705 B1 | 4/2001 | Al-Shamma | |
| 7,391,654 B2 | 6/2008 | Aritome | |
| 7,414,891 B2 | 8/2008 | Sivero et al. | |
| 7,468,926 B2 | 12/2008 | Shappir et al. | |
| 7,522,457 B2 | 4/2009 | Hemink et al. | |
| 7,606,076 B2 | 10/2009 | Nguyen et al. | |
| 7,751,242 B2 | 7/2010 | Roohparvar et al. | |
| 7,920,422 B2 * | 4/2011 | Mokhlesi | G11C 7/02 365/185.03 |
| 8,023,334 B2 | 9/2011 | Hoei et al. | |
| 8,036,044 B2 | 10/2011 | Dong et al. | |
| 8,081,519 B2 | 12/2011 | Lee et al. | |
| 8,130,551 B2 * | 3/2012 | Oowada | G11C 11/5635 365/185.19 |
| 8,223,555 B2 | 7/2012 | Kim et al. | |
| 8,670,273 B2 | 3/2014 | Aritome et al. | |
| 8,867,271 B2 * | 10/2014 | Li | G11C 16/0483 365/185.02 |
| 8,947,939 B2 * | 2/2015 | Tsai | G11C 16/0483 365/185.19 |
| 8,971,125 B2 * | 3/2015 | He | G11C 11/5635 365/185.22 |
| 9,099,202 B2 * | 8/2015 | Mihnea | G11C 11/5671 |
| 9,142,304 B2 * | 9/2015 | Costa | G11C 5/02 |
| 2004/0095802 A1 | 5/2004 | Tran | |
| 2007/0103974 A1 | 5/2007 | Takeguchi | |
| 2013/0058171 A1 | 3/2013 | Shiino et al. | |
| 2014/0003147 A1 | 1/2014 | Dutta et al. | |
| 2014/0043916 A1 | 2/2014 | Costa et al. | |
| 2014/0098615 A1 | 4/2014 | Mu et al. | |
| 2014/0269090 A1 | 9/2014 | Flynn et al. | |

OTHER PUBLICATIONS

U.S. Appl. No. 14/619,875, filed Feb. 11, 2015.
International Search Report & The Written Opinion of the International Searching Authority dated Feb. 25, 2016, International Application No. PCT/US2015/062621.

\* cited by examiner

*Primary Examiner* — Trong Phan
(74) *Attorney, Agent, or Firm* — Vierra Magen Marcus LLP

(57) ABSTRACT

Reducing peak current and/or power consumption during erase verify of a non-volatile memory is disclosed. During an erase verify, memory cells are verified at a strict reference level that is deeper (e.g., lower threshold voltage) than a target reference level. After the strict erase verify, strings of memory cells that pass the strict erase verify are locked out from a next erase verify at the target reference level. Locked out strings do not conduct a significant current during erase verify, thus reducing peak current and/or power consumption.

20 Claims, 28 Drawing Sheets

First programming pass

Second programming pass

Fig. 8A
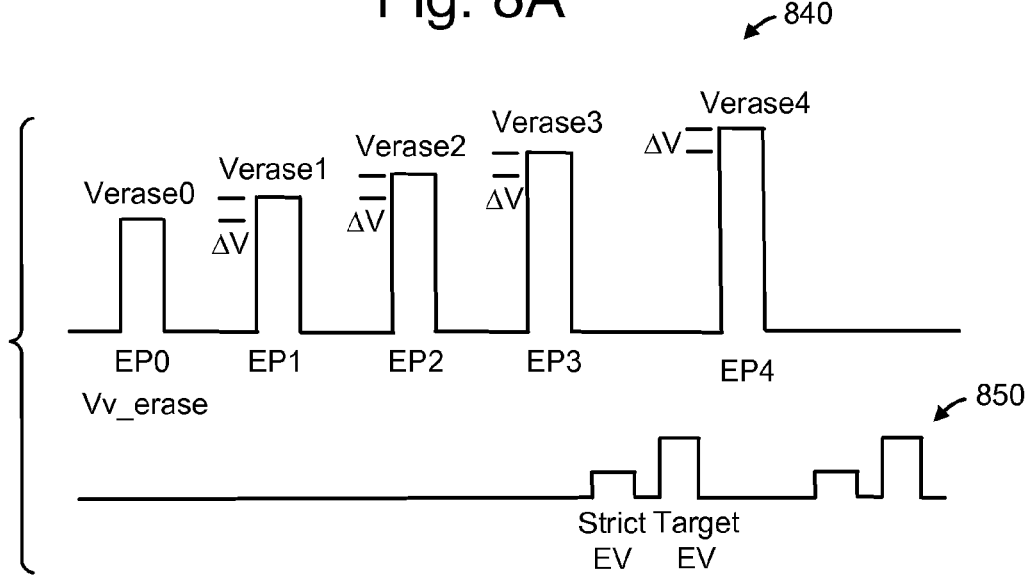
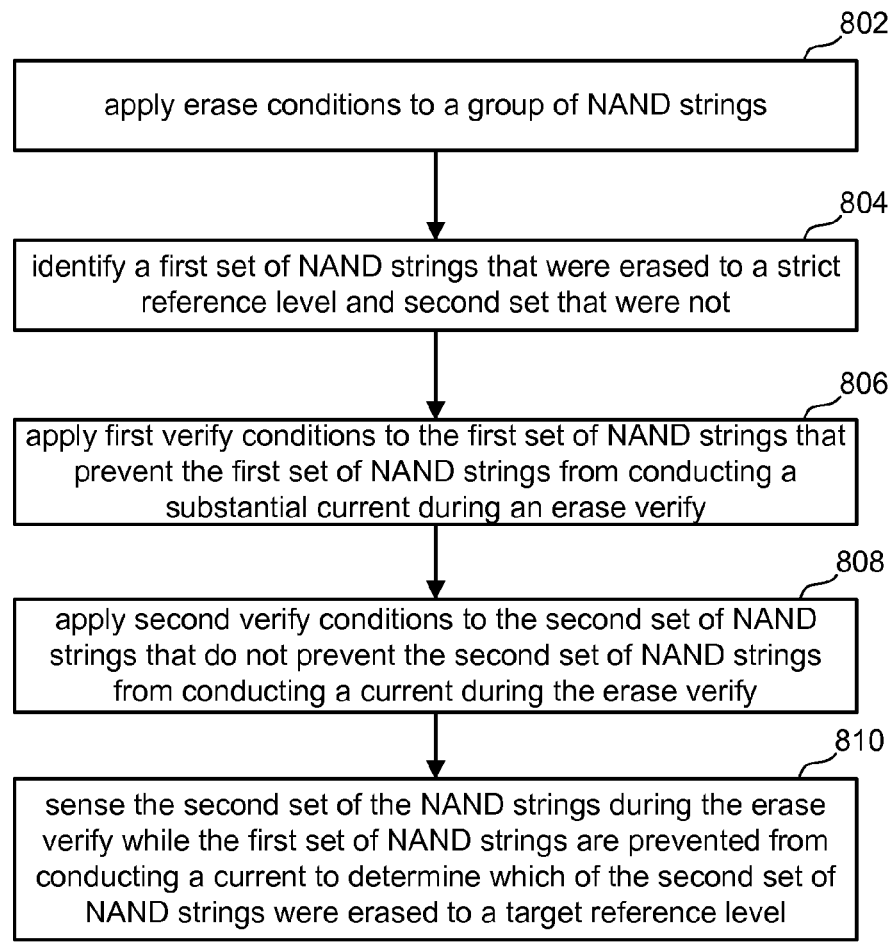
Fig. 8B

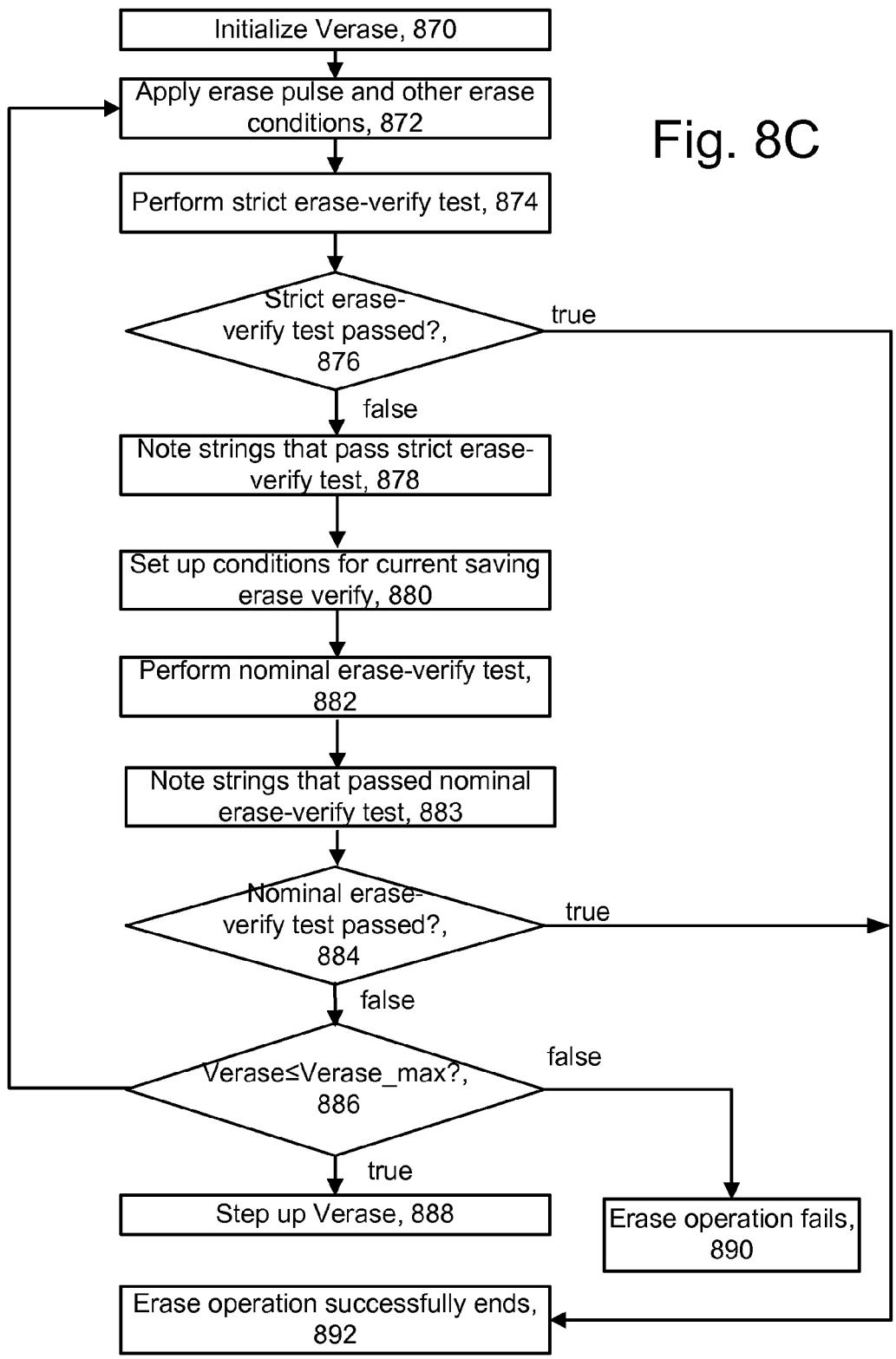

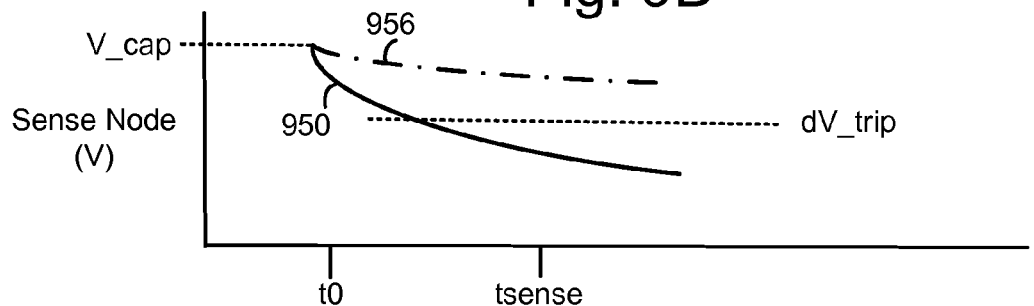
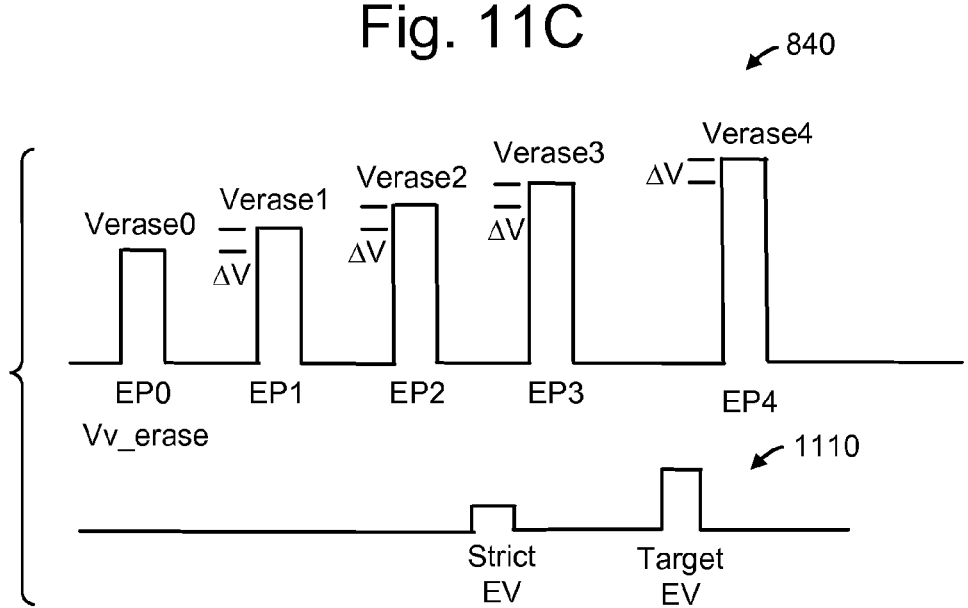

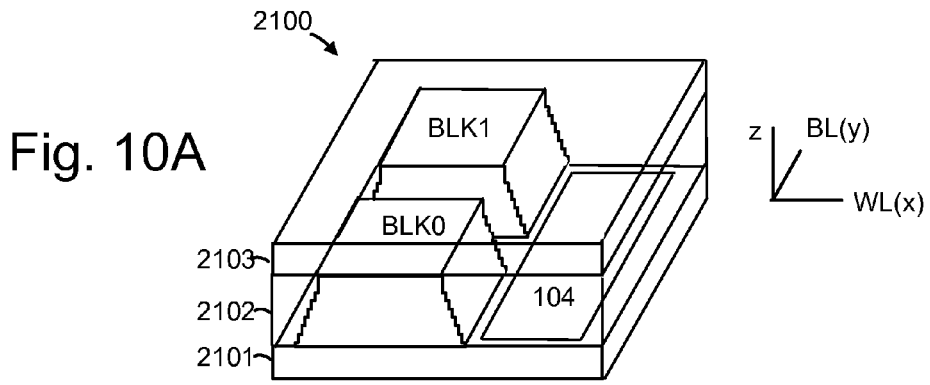
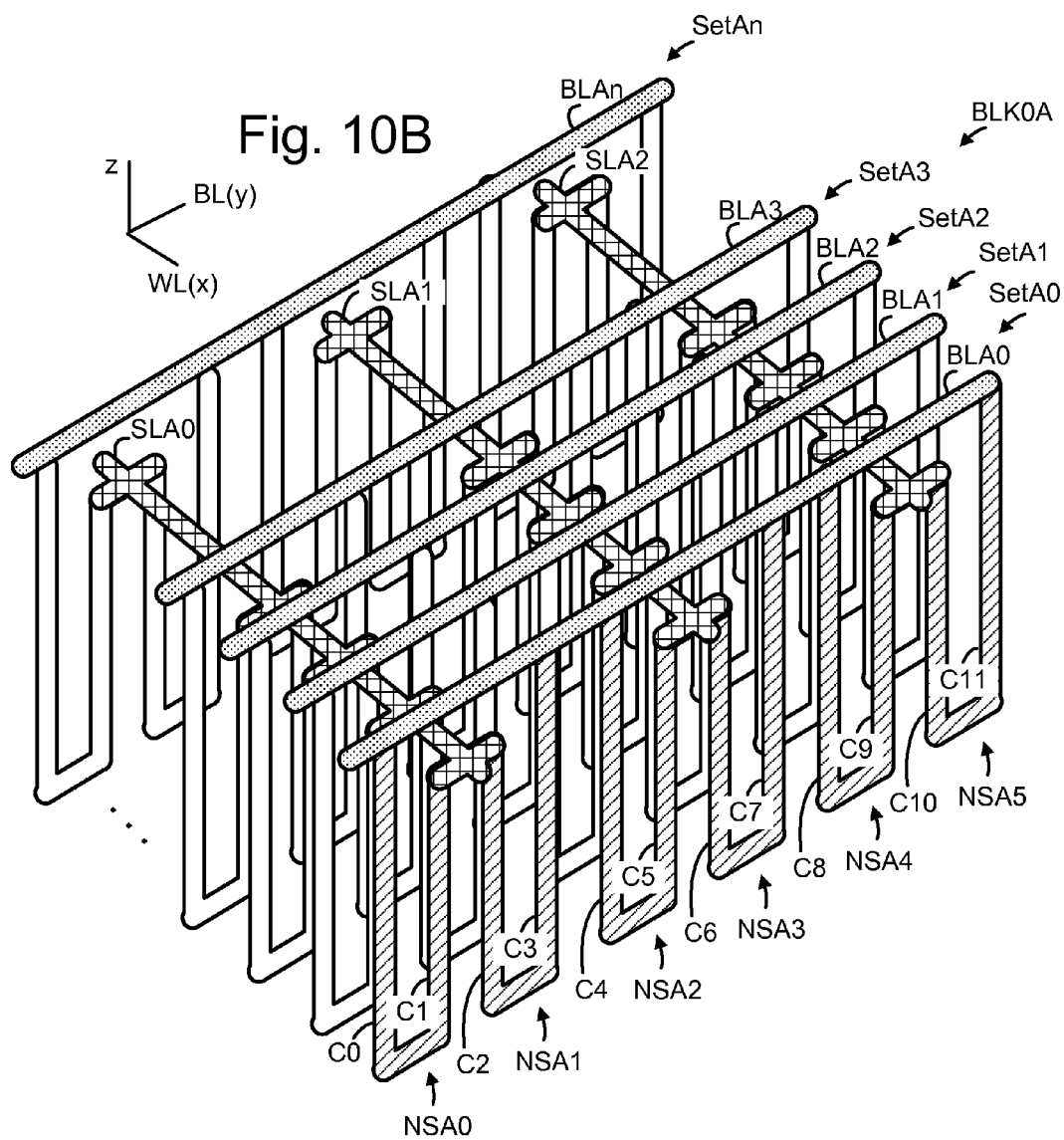

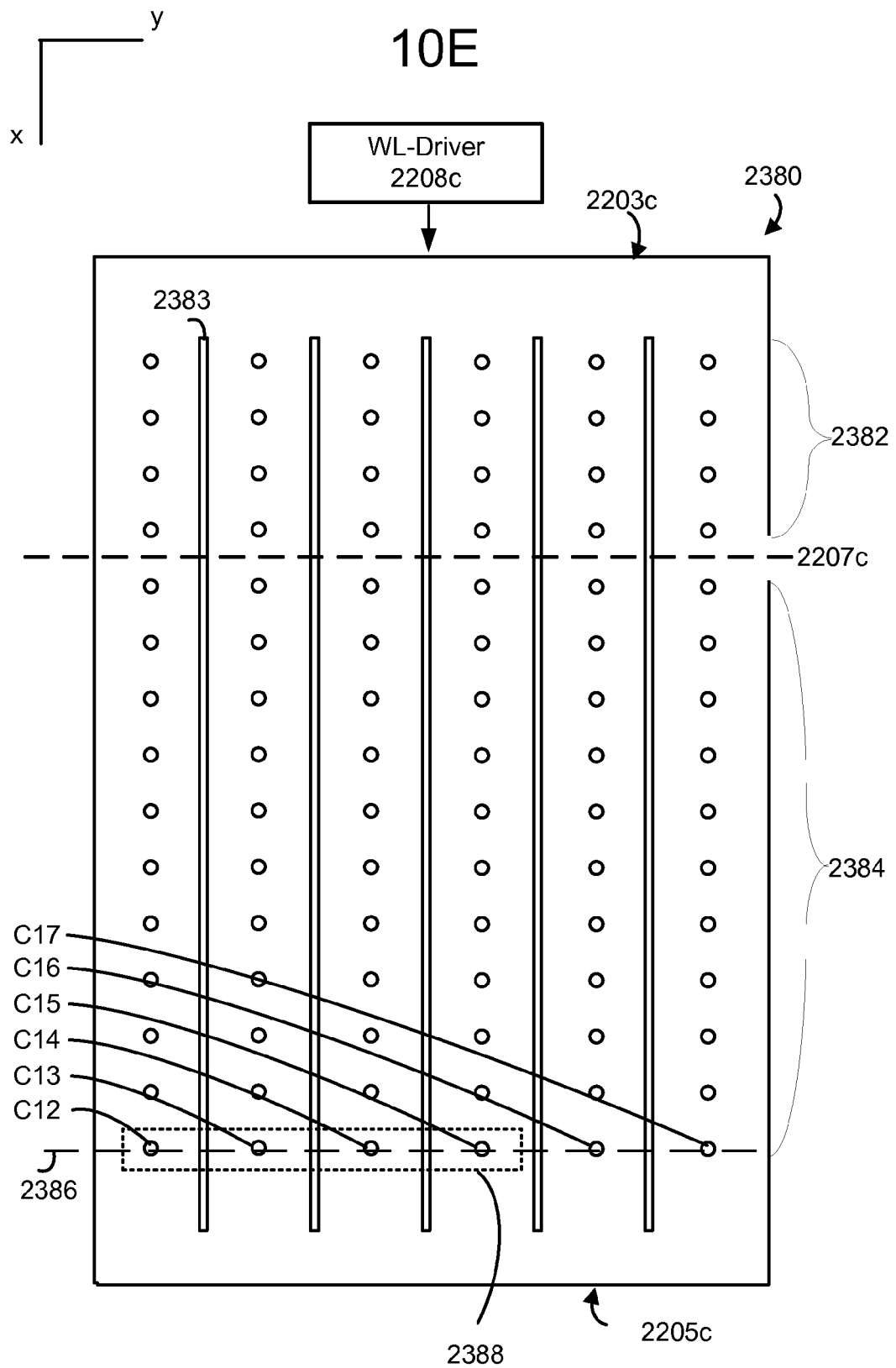

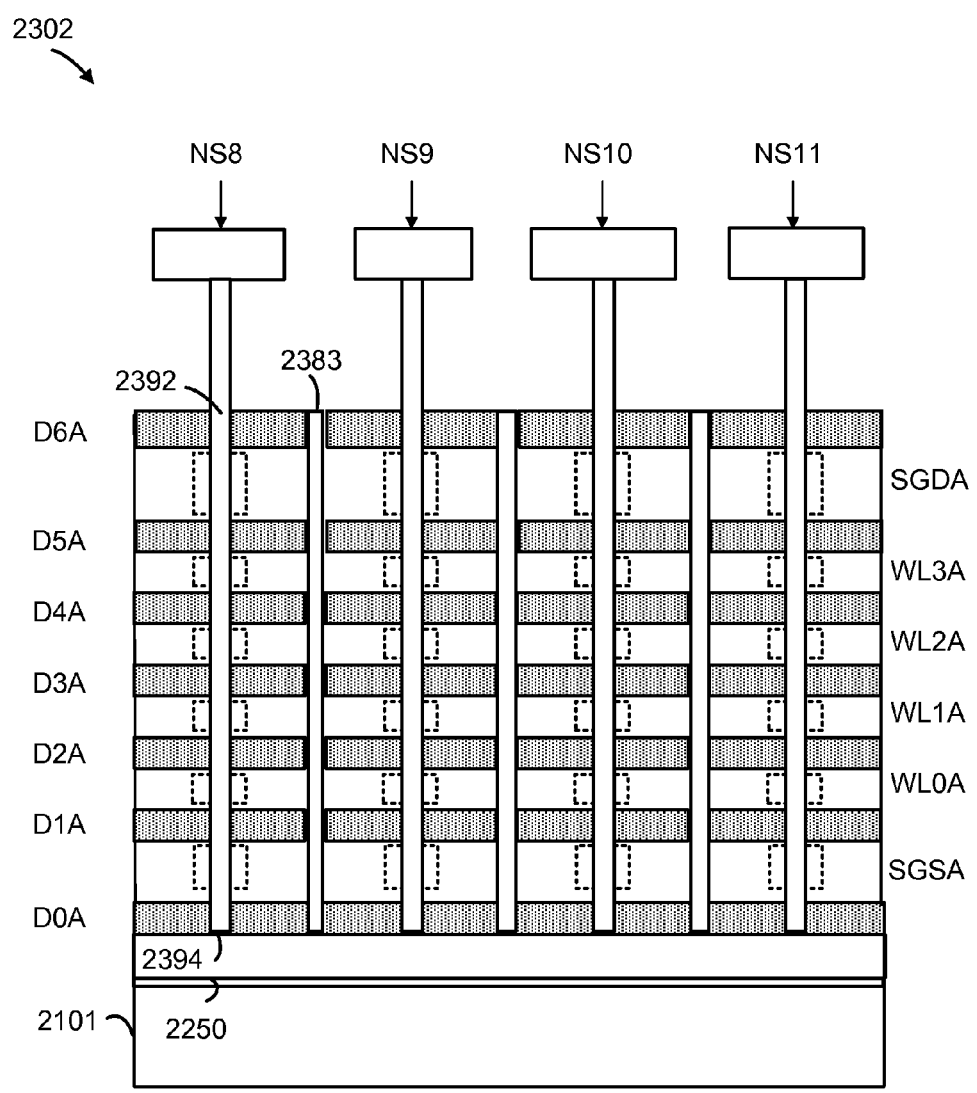

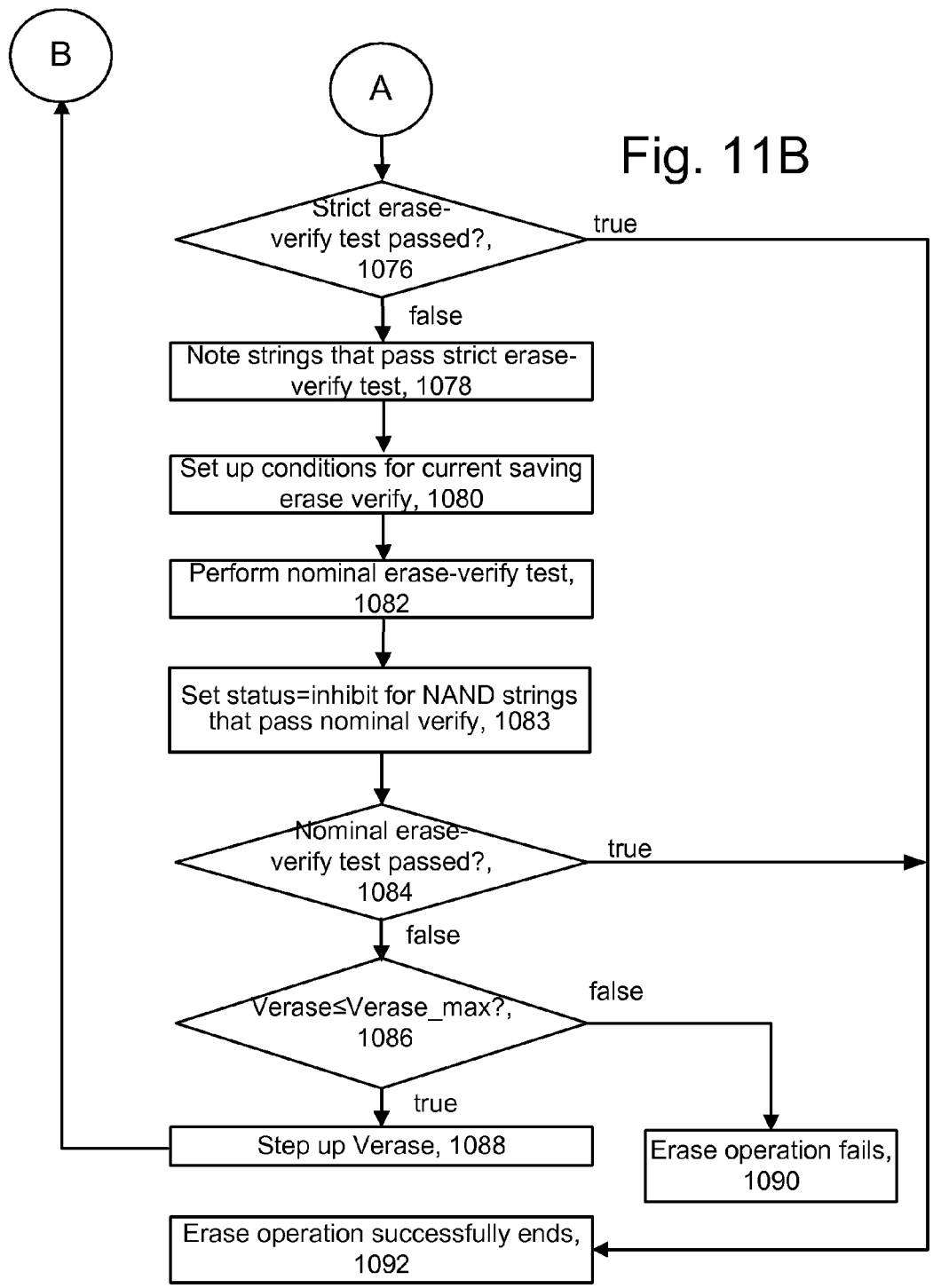

ERASE VERIFY IN NON-VOLATILE MEMORY

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some non-volatile memory store information in a charge storage region that is insulated from a channel region in a semiconductor substrate. As one example, a floating gate is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some non-volatile memory utilizes a charge trapping layer to store information. One such example has an oxide-nitride-oxide (ONO) region, in which the nitride (e.g., SiN) serves as a charge trapping layer to store information. When such a memory cell is programmed, electrons are stored in the charge trapping layer.

Non-volatile memory could have a 2D architecture or a 3D architecture. Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. Control gates of the memory cells are provided by the conductor layers.

Prior to programming certain non-volatile memory devices, such as a NAND flash memory device, the memory cells are erased. The erase operation removes electrons from the floating gate, for some devices. For some devices, the erase operation removes electrons from the charge trapping layer. Thus, the erase may lower the threshold voltage of the memory cell.

BRIEF DESCRIPTION OF THE DRAWINGS

FIG. 8A shows a series of erase pulses and erase verify reference levels that are used during one embodiment.

FIG. 8B is a flowchart of one embodiment of a process of erasing memory cells using an erase verify that reduces peak current and/or power consumption.

FIG. 8C depicts one embodiment of an erase operation with erase verify that may be used for 2D NAND.

FIG. 9D depicts curves when sensing a current for the sensing scheme of FIGS. 9A-9C.

FIG. 10A is a perspective view of a 3D stacked non-volatile memory device.

FIG. 10B depicts an embodiment of block which includes U-shaped NAND strings.

FIG. 10E depicts a top view of a straight NAND string embodiment of the block BLK0 of FIG. 10A.

FIG. 10F depicts a cross-sectional view of a portion of the block of FIG. 10E.

FIGS. 11A and 11B depict a flowchart of one embodiment of a process of performing an erase operation in 3D NAND having an erase verify.

FIG. 11C shows a series of erase pulses and erase verify reference levels that are used during one embodiment.

DETAILED DESCRIPTION

Figure 1A:
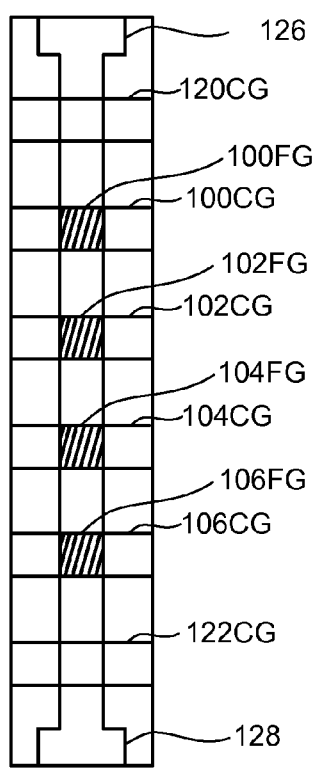
FIG. 1A is a top view of a NAND string.

Technology is described herein for reducing current and/or power consumption during a verify operation. In one embodiment, the verify operation is a verify operation of an erase operation of a non-volatile memory device such as a NAND memory device. In one embodiment, the verify operation is a verify operation of a program operation of a non-volatile memory device such as a NAND memory device. Embodiments are applicable to 2D NAND and 3D NAND, but not necessarily limited thereto.

At some point during a typical erase operation on non-volatile storage, the memory cells will have their threshold voltages verified. Typically, the memory cells are erased to a low threshold voltage, which may be negative. Erase verification may involve applying a voltage to a control gate of the memory cells and determine whether the memory cell conducts a significant current. The erase verification may determine whether the memory cell has a threshold voltage below some target threshold voltage. For some devices, the erase verify is performed on a NAND string basis. For the NAND string to pass erase verify, all of the memory cells on that NAND string should turn on and conduct a current.

The overall erase procedure may include applying erase conditions to a group of NAND strings and then performing an erase verify. If the erase verify indicates that erase of the NAND strings is not yet complete, erase conditions can be applied again followed by another erase verify. Note that it is not required that the erase verify be performed after every set of erase conditions. As the erase procedure progresses, more NAND strings should pass erase verify. Thus, the amount of current associated with NAND string conduction during erase verify late in the erase procedure, when most of the NAND strings have passed erase verify, can be considerable.

This high current consumption can be problematic. Moreover, it can be advantageous to reduce the peak current that occurs during the erase procedure. The current consumption is related to power consumption, as is well known. Thus, the peak current is related to the peak power consumption. Many memory devices are battery operated. Therefore, reducing power consumption may be desirable. Moreover, reducing the peak power consumption may be desirable. For many batteries, having a high peak current or high peak power consumption is very detrimental to battery life, even if the average current or power consumption is not very high. Even for memory devices that are not battery operated, reducing peak current or power has advantages.

Embodiments disclosed herein reduce the peak current during erase verify in a non-volatile storage device. In one embodiment, the device is a NAND memory device. In one embodiment, memory cells are first verified at a strict reference level that is deeper (e.g., lower threshold voltage) than a target reference level. The target reference level may be the highest threshold voltage that a memory cell is allowed to have to pass the erase procedure. The erase verify may be performed on a NAND string basis, which means that all memory cells on the NAND string should pass erase verify for the NAND string to pass. After the strict erase verify, strings of memory cells that pass the strict erase verify are locked out from a next erase verify at the target reference level. Since these strings are locked out during erase verify at the target reference level, they do not conduct a significant current during the erase verify at the target reference level. Therefore, the current that is consumed during the erase verify at the target reference level is reduced. This helps to reduce peak current consumption, as well as peak power consumption.

High current and/or power consumption is avoided during one embodiment of program verify. After the memory cells have been erased, one or more program pulses are applied to raise the threshold voltage of memory cells to some target threshold voltage, in one embodiment. Then, a program verify operation is performed to determine whether a given memory cell has been programmed to its intended threshold voltage. Early in the programming process (e.g., in early program loops), memory cells are expected to have a low threshold voltage. Hence, most memory cells will typically fail program verify. Since this failure is due to the memory cell's threshold voltage being below the program verify level, the memory cell will turn on and conduct a significant current. If most of the memory cells turn on and conduct a significant current then the cumulative effect is for a large current to be drawn.

In one embodiment, only those memory cells that program faster are verified early on in the programming process. A memory cell that is not verified may have its NAND string "locked out" such that the NAND string does not conduct a significant current. For example, only memory cells in a first physical segment of the selected word line are verified during an initial program loop; memory cells in a different physical segment of the word line are locked out and not verified. In one embodiment, the faster programming memory cells are close to the end of the word line at which the programming voltage was applied. This strategy saves current, since memory cells that are not verified will not conduct a significant current regardless of their threshold voltage. Later in the programming process all the memory cells are verified. For example, none of the NAND strings are locked out. However, this does not consume a substantial current because by this point, many (or most) of the memory cells have their threshold voltages above the program verify reference level.

A reason for selecting memory cells that are close to the end of the word line at which the programming voltage was applied for the early verify is that those memory cells may program faster than memory cells far from the end of the word line at which the programming voltage was applied. This effect is further discussed below. Herein, a faster programming memory cell refers to one for which its threshold voltage moves more for a given program pulse applied to the selected word line. Note that in some cases, the faster programming memory cells could be ones other than those closest to the end of the word line at which the programming pulse was applied.

Figure 1B:
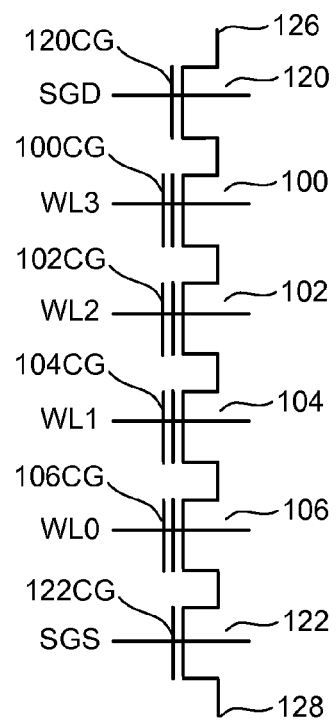
FIG. 1B is an equivalent circuit diagram of the NAND string of FIG. 1A.

Techniques disclosed herein may be applied to 2D NAND and 3D NAND, but are not necessarily limited thereto. A NAND flash memory structure may arrange multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
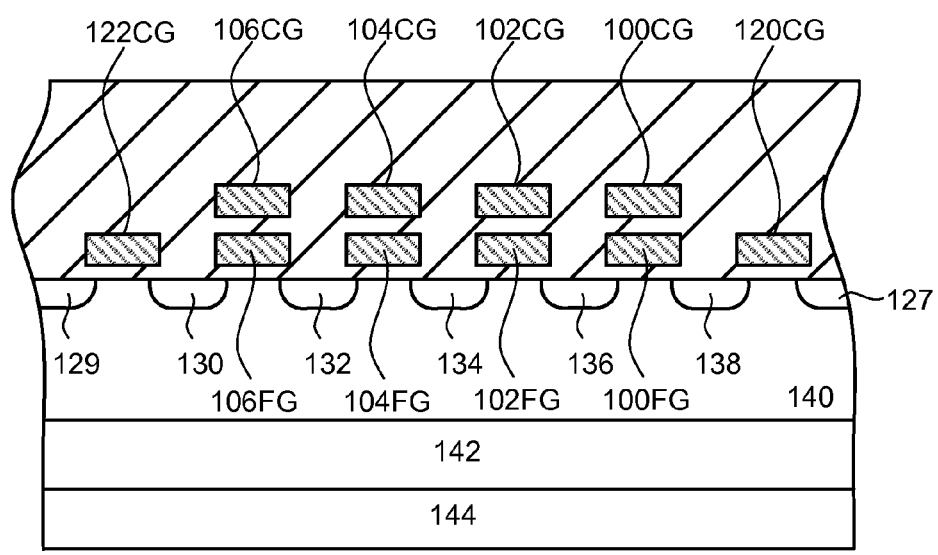
FIG. 2 is a cross-sectional view of the NAND string of FIG. 1A.

FIG. 2 provides a cross-sectional view of one embodiment of the NAND string described above. FIG. 2 is for a 2D NAND string formed in a substrate. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 127 connects to the bit line for the NAND string, while N+ doped layer 129 connects to a common source line for multiple NAND strings.

Note that although FIGS. 1A-2 show four memory cells in the NAND string, the use of four transistors is provided only as an example. A NAND string used with the technology described herein can have less than four memory cells or more than four memory cells. For example, some NAND strings will include 8, 16, 32, 64 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0V to the control gate, the memory cell will turn on to indicate logic one is being stored. When the threshold voltage is positive and a read operation is attempted by applying 0V to the control gate, the memory cell will not turn on, which indicates that logic zero is stored.

A memory cell can also store multiple states, thereby storing multiple bits of digital data. When storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present technology.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
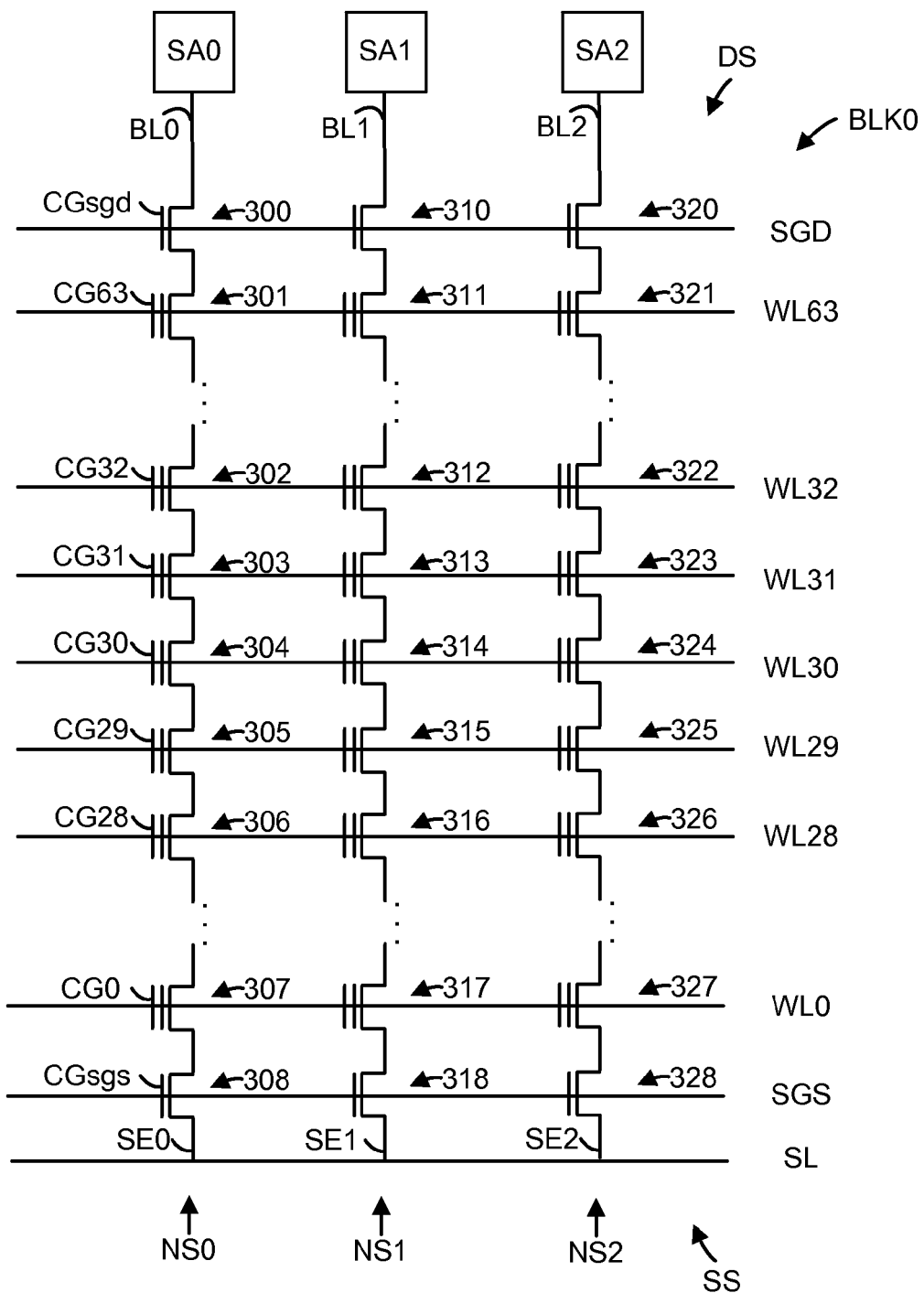
FIG. 3 depicts three example NAND strings, such as shown in FIGS. 1A-2, in a block BLK0.

FIG. 3 depicts three example NAND strings such as shown in FIGS. 1A-2 in a block BLK0. BLK0 includes a number of NAND strings NS0, NS1, NS2, . . . and respective bit lines, e.g., BL0, BL1, BL2 . . . in communication with respective sense amplifiers SA0, SA1, SA2, . . . BLK0 comprises a set of non-volatile storage elements. Each NAND string is connected at one end to a select gate, drain (SGD) transistor, and the control gates of the SGD transistors are connected via a common SGD line. The NAND strings are connected at their other end to a select gate, source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

An example NAND string NS0 includes storage elements 301, . . . , 302-306, . . . , 307 with respective control gates CG63, . . . CG32-CG28, . . . CG0, an SGS transistor 308 with a control gate CGsgs and a SGD transistor 300 with a control gate CGsgd. Another example NAND string NS1 includes storage elements 311, . . . , 312-316, . . . , 317, an SGS transistor 318 and a SGD transistor 310. Another example NAND string NS2 includes storage elements 321, . . . , 322-326, . . . , 327, an SGS transistor 328 and a SGD transistor 320. The NAND strings NS0, NS2, . . . are even numbered, and the NAND strings NS1, NS3 (not shown), . . . are odd numbered. Similarly, the bit lines BL0, BL2, . . . are even numbered, and the NAND strings BL1, BL3 (not shown), . . . are odd numbered. The storage elements can store user data and/or non-user data.

Figure 4:
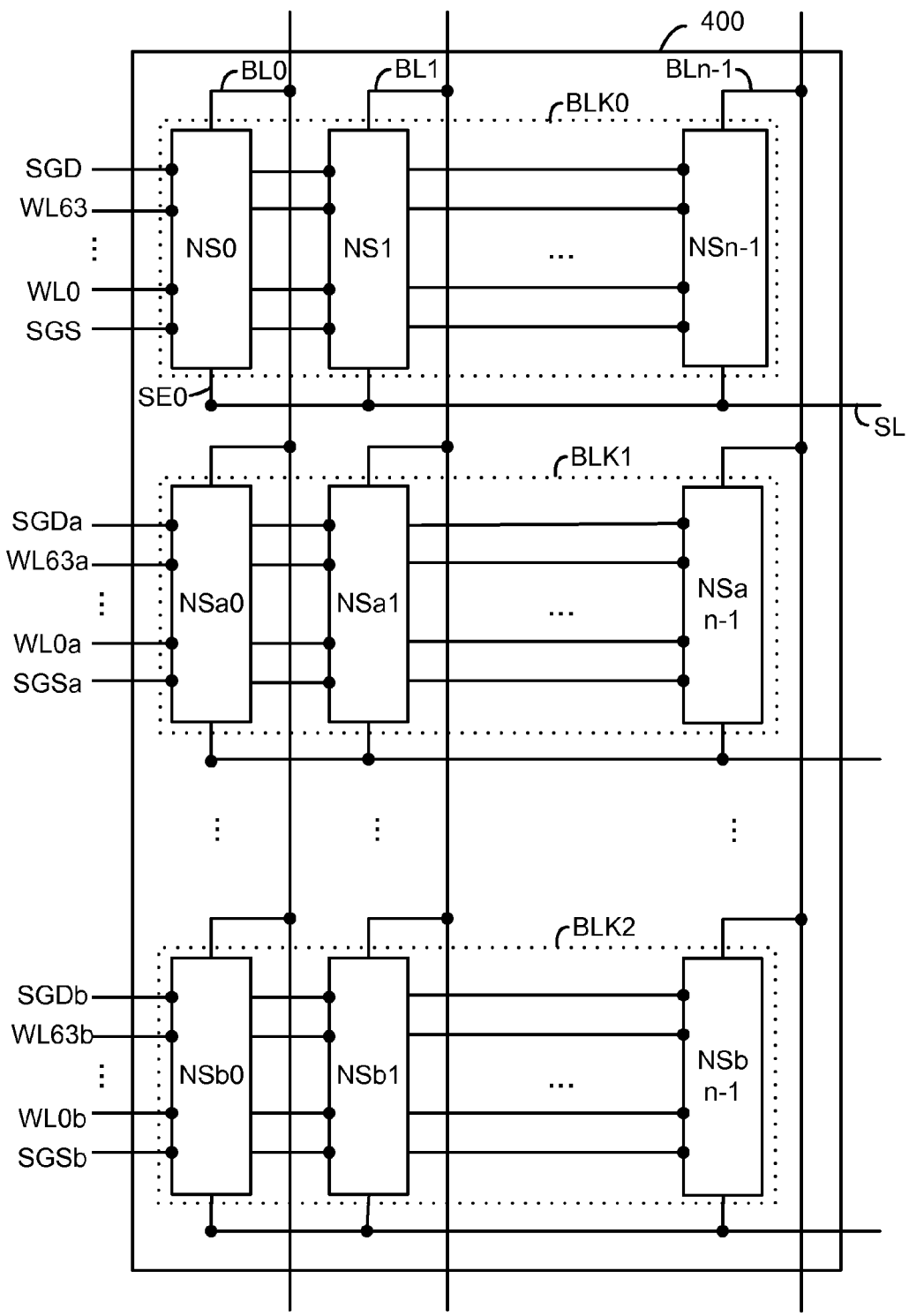
FIG. 4 is a block diagram of an array of NAND flash memory cells including BLK0 of FIG. 3 and additional blocks BLK1 and BLK2.

FIG. 4 is a block diagram of an array 400 of NAND flash memory cells including BLK0 of FIG. 3 and additional blocks BLK1 and BLK2. Along each column, a bit line (BL) is coupled to the drain terminal of the drain select gate for the NAND string. Along each row of NAND strings, a source line (SL) may connect all the source terminals of the source select gates of the NAND strings (e.g., at SE0 of NS0).

The array of storage elements is divided into a large number of blocks (e.g., BLK0-BLK2) of storage elements, where each block includes a set of one or more NAND strings in communication with a common set of word lines, SGS line and SGD line. Each NAND string is also in communication with a respective bit line. For example, BLK0 includes NAND strings NS0, NS1, . . . , NSn-1 in communication with BL0, BL1, . . . BLn-1, respectively, and with WL0-WL63 SGS and SGD. BLK1 includes NAND strings NSa0, NSa1, . . . , NSan-1 in communication with BL0, BL1, . . . BLn-1, respectively, and with WL0a-WL63a, SGSa and SGDa. BLK2 includes NAND strings NSb0, NSb1, . . . , NSbn-1 in communication with BL0, BL1, . . . BLn-1, respectively, and with WL0b-WL63b, SGSb and SGDb.

The block is the unit of erase for some embodiments. That is, each block contains the minimum number of storage elements that are erased together for some embodiments. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 15-20 V) for a sufficient period of time and grounding or applying a low bias, e.g., 1 V, on the word lines of a selected block while the source and bit lines are floating. Due to capacitive cross coupling ("cross" denotes coupling from neighboring storage elements), the bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells. In one embodiment, 3D NAND is erased using a different technique. 3D NAND will be further discussed below.

Figure 5A:
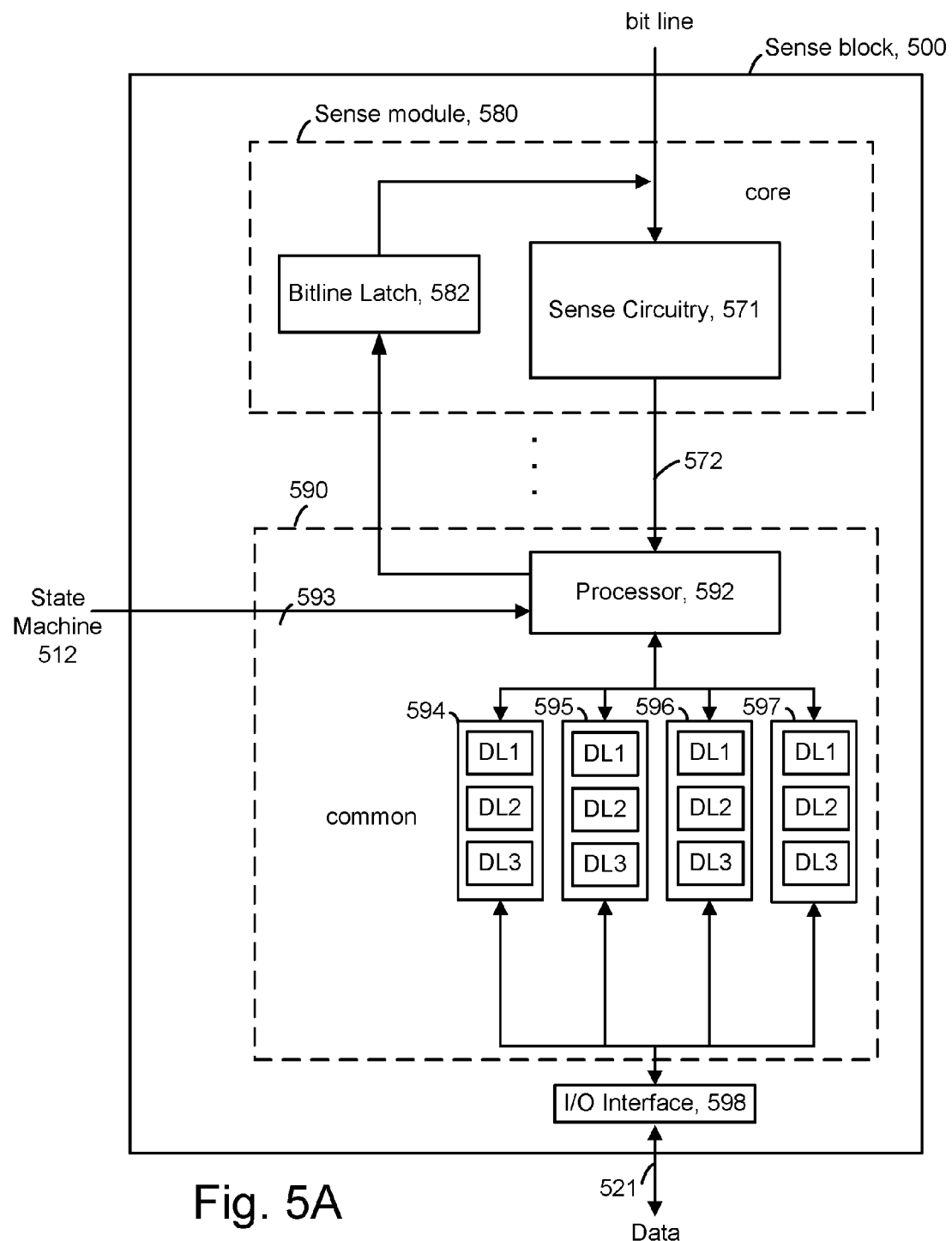
FIG. 5A is a block diagram depicting one embodiment of a sense block.

FIG. 5A is a block diagram depicting one embodiment of a sense block 500. An individual sense block 500 is partitioned into a core portion, referred to as a sense module 580, and a common portion 590. In one embodiment, there is a separate sense module 580 for each bit line and one common portion 590 for a set of multiple sense modules 580. In one example, a sense block 500 will include one common portion 590 and eight sense modules 580. Each of the sense modules in a group will communicate with the associated common portion via a data bus 572.

Sense module 580 comprises sense circuitry 571 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V). As an example, a flag=0 can inhibit programming, while flag=1 does not inhibit programming.

Common portion 590 comprises a processor 592, four example sets of data latches 594, 595, 596, 597 and an I/O Interface 598 coupled between the sets of data latches 594-597 and data bus 521. One set of data latches can be provided for each sense module, and three data latches identified by DL1, DL2, and DL3 may be provided for each set. The use of the data latches is further discussed below.

Processor 592 performs computations. For example, one of its functions is to determine the data stored in the sensed storage element and store the determined data in the set of data latches. At least some of the data latches in a set of data latches (e.g., 594) are used to store data bits determined by processor 592 during a read operation. At least some of the data latches in a set of data latches are also used to store data bits imported from the data bus 521 during a program operation. The imported data bits represent write data meant to be programmed into the memory. I/O interface 598 provides an interface between data latches 594-697 and the data bus 521.

In one embodiment, data is stored in the DL1 and DL2 latches at the beginning of the program operation. For example, lower page data may be stored in DL1 and upper page data may be stored in DL2. In one embodiment, lower page data that is read from memory cells during an IDL is stored in the DL1 latches. DL3 may be used to store verify status, such as lockout status during programming. For example, when a memory cell's Vt has been verified a reaching its target level, the DL3 latch can be set to indicate this such that further programming of the memory cell may be inhibited. Note this describes programming two bits per memory cell. In one embodiment, during a read operation, the DL1 and DL2 latches are used to store the two bits that are read from the memory cell. Note that there may be more than two bits per memory cell. There can be one additional latch for each additional bit to be stored per memory cell.

During reading or other sensing, the state machine 512 controls the supply of different control gate voltages to the addressed storage element. As it steps through the various control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches (e.g., 594). In another embodiment of the core portion, bit line latch 582 serves both as a latch for latching the output of the sense module 580 and as a bit line latch as described above.

Some implementations can include multiple processors 592. In one embodiment, each processor 592 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 594-597 from the data bus 521. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Each set of data latch stacks 594-597 contains a stack of data latches corresponding to the sense module 580, in one embodiment. In one embodiment, there are three data latches per sense module 580. All the DL1 and DL2 data latches corresponding to the read/write block of m storage elements can be linked together to form a block shift register so that a block of data can be input or output by serial transfer.

In one embodiment, one purpose of the DL1 and DL2 latches is to store data that is to be programmed into a storage element. For example, the storage elements may store two bits per storage element. In one embodiment, lower page data is initially stored into the DL1 latches and upper page data is initially stored into the DL2 latches.

In one embodiment, the storage elements store three bits per storage element. In this case, there may be an additional data latch (not depicted in FIG. 5A) for initially storing the third bit of data that is to be programmed into a storage element. In one embodiment, the storage elements four bits per storage element, in which there may be two additional data latches (not depicted in FIG. 5A) for initially storing the third and fourth bits of data that is to be programmed into a storage element. The storage elements could store more than four bits per storage element, in which case there may be one data latch for each bit.

Figure 5B:
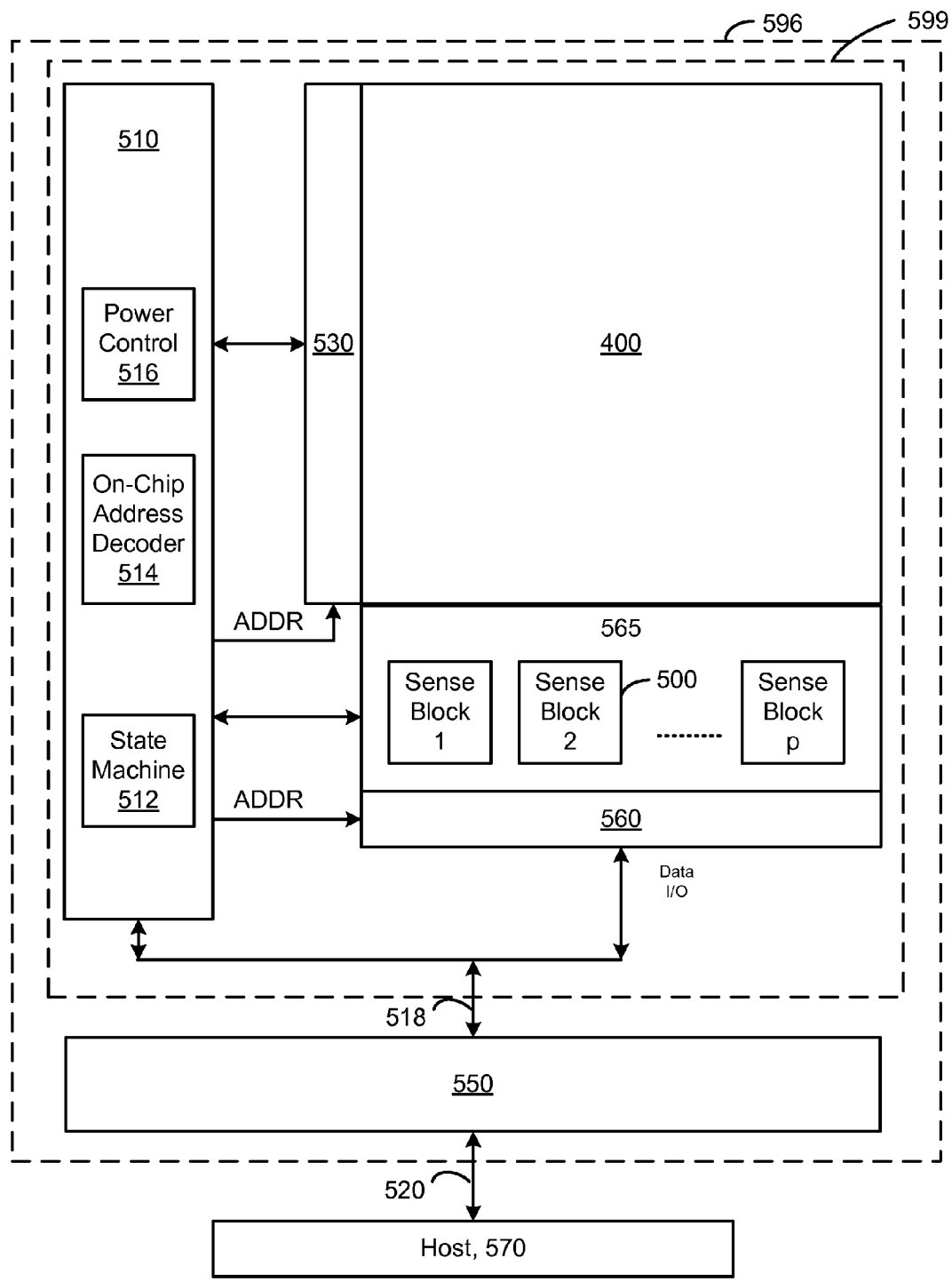
FIG. 5B is a block diagram of a non-volatile memory system which includes the array of FIG. 4.

FIG. 5B is a block diagram of a non-volatile memory system which includes the array 400 of FIG. 4. The memory array 400 could include a 2D architecture or a 3D architecture. One example of a 3D architecture is a BiCS architecture. A 3D architecture may include 3D vertical NAND strings above a substrate. The memory cells in 3D vertical NAND strings may include an ONO layer to store information. The information may be stored in a charge trapping layer such as, but not limited to, SiN. Note that an ONO layer can be used to store information for both 2D and 3D NAND, as well as other architectures. Thus, a floating gate may be used to store information, but is not required.

The non-volatile memory system comprises a memory device 596 having read/write circuits for reading and programming a page of memory cells in parallel, according to one embodiment of the present technology. Memory device 596 may include one or more memory die 599. Memory die 599 includes a two-dimensional array of memory cells 400, control circuitry 510, and read/write circuits 565. The memory array 400 is addressable by word lines via a row decoder 530 and by bit lines via a column decoder 560. The read/write circuits 565 include multiple sense blocks 500 (e.g., Sense Block 1, Sense Block 2, . . . Sense Block p) and allow a page of memory cells to be read or programmed in parallel. Typically a controller 550 is included in the same memory device 596 (e.g., a removable storage card) as the one or more memory die 599. Commands and Data are transferred between the host 570 and controller 550 via lines 520 and between the controller and the one or more memory die 599 via lines 518 (see Data I/O in FIG. 5B).

The control circuitry 510 cooperates with the read/write circuits 565 to perform memory operations on the memory array 400. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address (ADDR) used by the decoders 530 and 560. The power control module 516 controls the power and voltages supplied to the word lines and bit lines during memory operations. In another approach, dual row/column decoders and read/write circuits are used. A control circuit can be considered to comprise one or more of the components 510, 512, 514, 516, 530, 550, 560, 565, for instance. The control circuit may also be referred to as managing circuitry.

Figure 6:
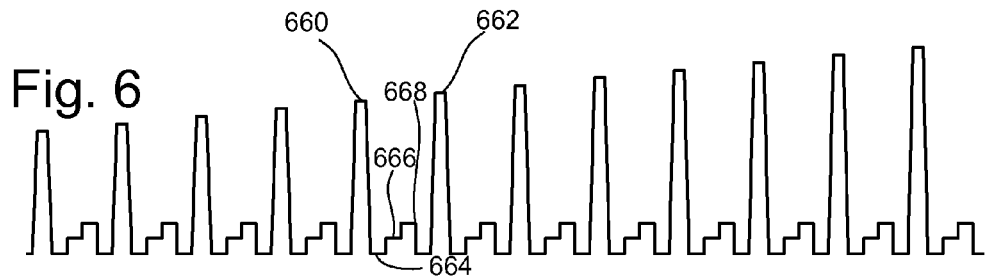
FIG. 6 depicts a program voltage signal in accordance with one embodiment.
Figure 6:
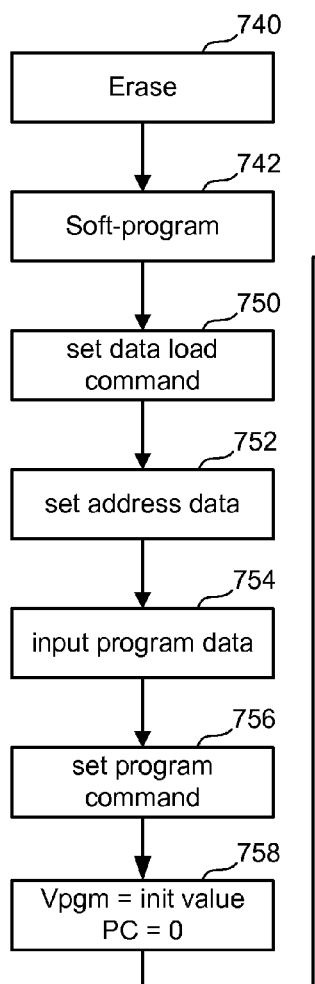

FIG. 6 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2 volts (or 0.4 volts). Between each of the program pulses are the verify pulses. The signal of FIG. 6 assumes a four state memory cell, therefore, it includes three verify pulses. For example, between programming pulses 660 and 662 are three sequential verify pulses. The first verify pulse 664 is depicted at a zero volt verify voltage level. The second verify pulse 666 follows the first verify pulse at the second verify voltage level. The third verify pulse 668 follows the second verify pulse 666 at the third verify voltage level. A multi-state memory cell capable of storing data in eight states may need to perform verify operations at seven compare points. Thus, seven verify pulses are applied in sequence to perform seven verify operations at seven verify levels after each programming pulse. Based on the seven verify operations, the system can determine the state of the memory cells. In some cases, there will be a single verify pulse.

Figure 7A:
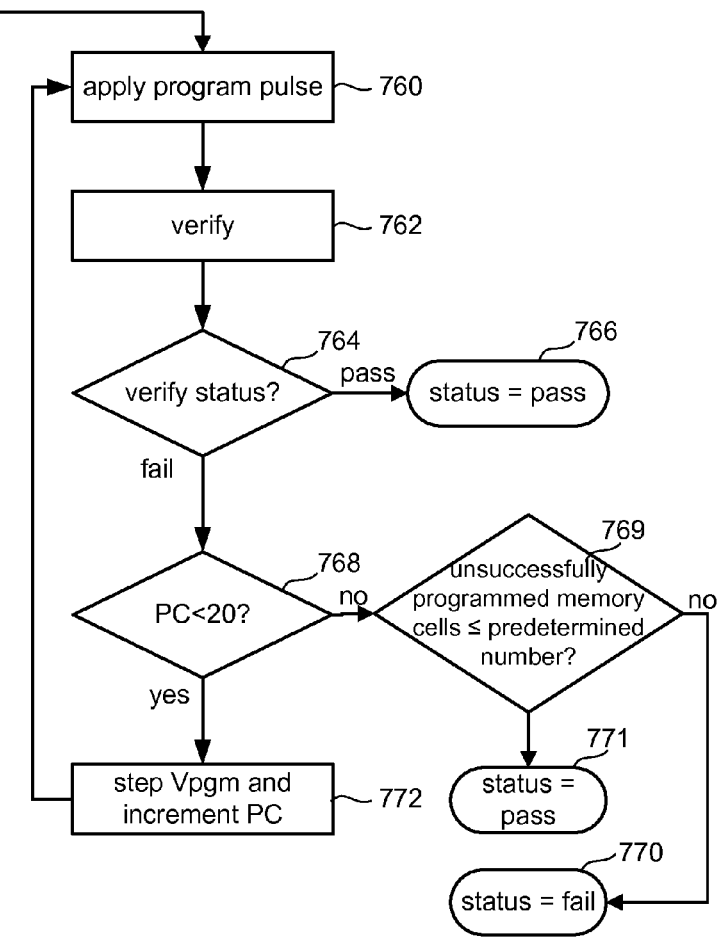
FIG. 7A is a flow chart describing one embodiment of a method for programming non-volatile memory.

FIG. 7A is a flow chart describing one embodiment of a method for programming non-volatile memory. The memory cells to be programmed are erased at step 740. Step 740 can include erasing more memory cells than those to be programmed (e.g., in blocks or other units). Step 740 includes performing an erase verify. In one embodiment, erase conditions that reduce current and/or power consumption are applied during erase verify.

At step 742, soft-programming is performed to narrow the distribution of erased threshold voltages for the erased memory cells. Some memory cells may be in a deeper erased state than necessary as a result of the erase process. Soft-programming can apply small programming pulses to move the threshold voltage of the erased memory cells closer to the erase verify level. At step 750 of FIG. 7A, a "data load" command is issued by controller 550 and input to command circuits, allowing data to be input to data input/output buffer. At step 752, address data designating the page address is input to row controller or decoder 514 from the controller or host. The input data is recognized as the page address and latched via state machine 512, affected by the address latch signal input to command circuits. At step 754, a page of program data for the addressed page is input to data input/output buffer for programming. For example, 512 bytes of data could be input in one embodiment. That data is latched in the appropriate registers for the selected bit lines. In some embodiments, the data is also latched in a second register for the selected bit lines to be used for verify operations. At step 756, a "program" command is issued by the controller and input to data input/output buffer. The command is latched by state machine 512 via the command latch signal input to command circuits.

Triggered by the "program" command, the data latched in step 754 will be programmed into the selected memory cells controlled by state machine 512 using the stepped pulses of FIG. 6 applied to the appropriate word line. At step 758, Vpgm, the programming pulse voltage level applied to the selected word line, is initialized to the starting pulse (e.g., 12V) and a program counter PC maintained by state machine 512 is initialized at 0. At step 760, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming.

At step 762, the states of the selected memory cells are verified. In one embodiment, conditions are applied during program verify that reduce current and/or power consumption. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 764, it is checked whether all of the data latches are storing logic "1." If so, the programming process is complete and successful because all selected memory cells were programmed and verified to their target states. A status of "PASS" is reported at step 766.

If, at step 764, it is determined that not all of the data latches are storing logic "1," then the programming process continues. At step 768, the program counter PC is checked against a program limit value. One example of a program limit value is 20, however, other values can be used in various implementations. If the program counter PC is not less than 20, then it is determined at step 769 whether the number of bits that have not been successfully programmed is equal to or less than a predetermined number. If the number of unsuccessfully programmed bits is equal to or less than the predetermined number, then the programming process is flagged as passed and a status of pass is reported at step 771. The bits that are not successfully programmed can be corrected using error correction during the read process. If however, the number of unsuccessfully programmed bits is greater than the predetermined number, the program process is flagged as failed and a status of fail is reported at step 770. If the program counter PC is less than 20, then the Vpgm level is increased by the step size and the program counter PC is incremented at step 772. After step 772, the process loops back to step 760 to apply the next Vpgm pulse.

The flowchart of FIG. 7A depicts a single-pass programming method as can be applied for binary storage. In a two-pass programming method as can be applied for multi-level storage, for example, multiple programming or verification steps may be used in a single iteration of the flowchart. Steps 758-772 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 7B:
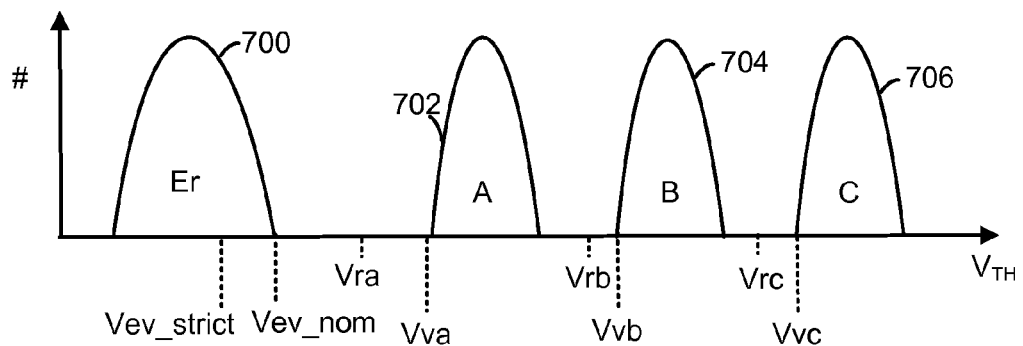
FIG. 7B illustrates exemplary threshold voltage distributions for a memory cell array when each memory cell stores two bits of data in four physical states.

At the end of a successful program process, the threshold voltages of the memory cells should be within one or more distributions of threshold voltages for programmed memory cells or within a distribution of threshold voltages for erased memory cells. FIG. 7B illustrates exemplary threshold voltage distributions for a memory cell array when each memory cell stores two bits of data in four physical states. Distribution 700 represents a distribution of threshold voltages of cells that are in an erased state (storing "11"), which may have negative threshold voltage levels. Distribution 702 represents a distribution of threshold voltages of cells that are in a first programmed state ("A"), storing "10." Distribution 704 represents a distribution of threshold voltages of cells that are in a second programmed state ("B"), storing "00." Distribution 706 represents a distribution of threshold voltages of cells that are in a third programmed state ("C"), storing "01." In one embodiment, each memory cell stores a single bit. In this case, there are only two threshold distributions.

When programming the memory cells, they may be verified using program verify reference levels Vva, Vvb, and Vvc, for the A-C states respectively. When reading the memory cells, the read reference level Vra may be used to determine whether memory cells at the A-state distribution or higher. Likewise, Vrb and Vrc are read reference levels for the B- and C-states, respectively.

Figure 7C:
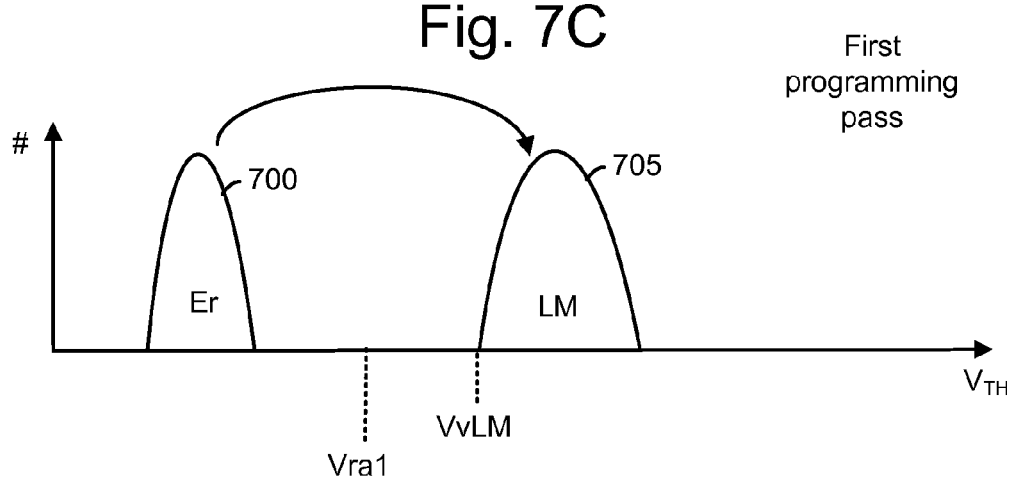
FIGS. 7C and 7D depict a two pass programming sequence in accordance with one embodiment.
Figure 7D:
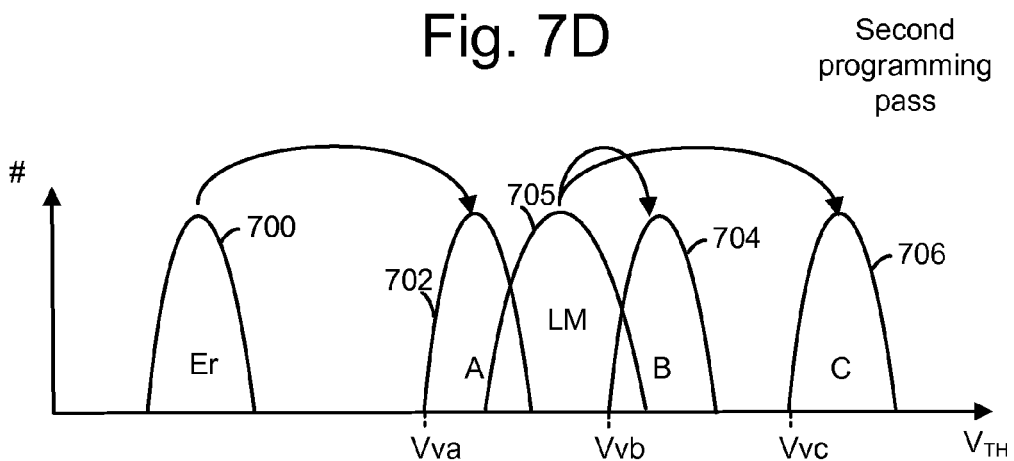

FIGS. 7C and 7D depict a two pass programming sequence in accordance with one embodiment. In the first pass, the lower page is programmed. In the second pass the upper page is programmed. As depicted in FIG. 7C, in the first pass storage elements intended for either the B- or C-states are programmed to an intermediate state 705. The intermediate state 705 has a verify level of VvLM.

As depicted in FIG. 7D, in the second pass programming to the A-, B-, and C-states is completed. Storage elements targeted for the A-state are programmed from the Er-state 700 to the A-state 702. Storage elements targeted for the B-state are programmed from the LM-state 705 to the B-state 704. Storage elements targeted for the C-state are programmed from the LM-state 705 to the C-state 706. FIGS. 7B-7D are labeled "#" (number) on one axis and Vth (threshold voltage) on the other axis.

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

Returning now to the discussion of one embodiment of the erase procedure, two erase verify reference levels are depicted in FIG. 7B ($V_{EV\_STRICT}$, $V_{EV\_NOM}$). $V_{EV\_NOM}$ is a nominal or target reference level that the memory cells are to be erased to in order to pass the erase procedure. This is depicted at the right edge of the erase distribution to indicate that all or most memory cells will have their threshold voltage below $V_{EV\_NOM}$ when erase is complete. $V_{EV\_STRICT}$ is used to help reduce peak current and/or power consumption during erase verify. $V_{EV\_STRICT}$ is associated with a deeper erase than $V_{EV\_NOM}$. That is, a memory cell should have a lower threshold voltage to pass $V_{EV\_STRICT}$ than to pass $V_{EV\_NOM}$. The use of $V_{EV\_STRICT}$ will be discussed below.

FIG. 8A shows a series of erase pulses 840 (Verase0, Verase1, Verase2, Verase3, Verase4) and erase verify reference levels 850 that are used during one embodiment. The erase pulse ($V_{v\_ERASE}$) is stepped up gradually (e.g., $\Delta V$). In this example, four erase pulses (EP0-EP3) are applied to the memory cells prior to the first erase verify operation. During the erase verify operation, first the memory cells are verified for the strict erase verify reference level, Strict EV (e.g., $V_{EV\_STRICT}$). NAND strings that pass the strict erase verify are prevented from conducting a current during the next erase verify at the target or nominal erase verify level, Target EV (e.g., $V_{EV\_NOM}$). This reduces the current and/or power consumption during the target erase verify. If not all of the NAND strings have passed erase verify at the target erase verify reference level, then another erase pulse is applied (e.g., EP4). The memory cells can then again be verified as just described with the strict erase verify followed by the target erase verify. In one embodiment, during this verify, the NAND strings that passed either of the stricter or target erase verify level may be prevented from conducting a current. This will reduce the current and or/power consumption during subsequent erase verifies.

FIG. 8B is a flowchart of one embodiment of a process of erasing memory cells using an erase verify that reduces peak current and/or power consumption. The process could be used during step 740 in FIG. 7A. The process may be used for 2D NAND or 3D NAND. The process describes applying erase conditions, such as one of the erase pulses of FIG. 8A, followed by an erase verify procedure. The process of FIG. 8B may be repeated more than once to complete the erase operation. The process may be performed by managing circuitry in FIG. 5B.

In step 802, erase conditions are applied to a group of NAND strings. The erase conditions may be different for 2D NAND than for 3D NAND. Further details are described below. As one example, a pulse such as EP3 in FIG. 8A is applied.

In step 804, the system determines or identifies which NAND strings were erased to a strict erase verify reference level as a result of application of the erase conditions. The strict erase verify level is a deeper erase than a target erase verify reference level. Step 804 divides the group of NAND strings into ones which passed the strict erase verify and those that did not pass the strict erase verify. As one example, the strict EV pulse between EP3 and EP4 in FIG. 8A is applied.

In step 806, the system (e.g., managing circuitry) applies first verify conditions to the first set of NAND strings that passed the strict erase verify. The first verify conditions prevent a given NAND string from conducting a current during an erase verify operation. This may be referred to a "locking out" a NAND string.

In step 808, the system applies second verify conditions to the second set of NAND strings that did not pass the strict erase verify. The second verify conditions do not prevent a given NAND string from conducting a current during the erase verify operation. Note that a given NAND string may or may not conduct a current, depending on whether it passes erase verify. In other words, the amount of current the NAND string conducts may depend on the threshold voltages of its memory cells.

In step 810, the second set of NAND strings are sensed during the erase verify operation while the first set of NAND strings are prevented from conducting a current (e.g., are locked out). Step 810 may include applying the Target EV pulse between EP3 and EP4 in FIG. 8A. Thus, the system determines which of the second set of NAND strings were erased to the target reference level. Since the first set of NAND strings passed erase verify at the strict erase verify reference level, it is expected that they would also pass erase verify at the target erase verify reference level. However, since the first set of NAND strings were locked out, they should not conduct a significant current during this erase verify. Thus, the first set of NAND strings should not significantly increase current and/or power consumption during the erase verify at the target reference level. This helps to reduce the peak current and/or power consumption. Note that additional erase conditions are not applied to the NAND strings between step 804 and 810, in one embodiment. Thus, the identifying in step 804 and the sensing in step 810 are both performed after the same set of erase conditions from step 802, in one embodiment.

The process can be repeated in a similar manner. The next cycle the erase pulse might be stepped in step 802 up to, for example, EP4 (see, FIG. 8A). The next time that the erase conditions are applied in step 806 and 808, memory cells that passed either the strict erase verify or the normal erase verify may be locked out (e.g., prevented from conducting a current). This will save power and/or current during subsequent applications of step 810.

As noted above, the erase procedure with erase verify can be applied to 2D NAND or 3D NAND. In one embodiment of erasing 2D NAND, memory cells are erased by raising the p-well to an erase voltage (e.g. 20 volts) and grounding or applying 0 volts to the word lines of a selected block while the source and bit lines are floating. Due to capacitive coupling, the unselected word lines (e.g., those in unselected, not to-be-erased blocks), bit lines, select lines, and common source lines are also raised to a high positive potential (e.g., 20V). A strong electric field is thus applied to the tunnel oxide layers of memory cells of a selected block and the data of the selected memory cells is erased as electrons of the floating gates are emitted to the substrate. Erasing refers to lowering the threshold voltage of a memory cell by transferring electrons out of its charge storage region (e.g., floating gate or charge trapping layer), in one embodiment. For devices have a floating gate, as sufficient electrons are transferred from the floating gate to the p-well region, the threshold voltage of a selected cell becomes negative. Once the threshold voltage reaches a predetermined sufficiently low value, the memory cell can be regarded as erased and the erase process deemed completed or successful. Thus, erasing a memory cell refers to lowering the threshold voltage of a memory cell and does not imply complete or successful erasing thereof. Erasing can be performed on the entire memory array, one or more blocks of the array, or another unit of cells. The erase voltage signal $V_{ERASE}$ is typically applied as a series of erase voltage pulses, with an erase verification operation being carried out in between each pulse. If the unit of cells being erased is not verified as erased after application of an erase voltage pulse, another erase voltage pulse can be applied to the p-well region. In some embodiments, the peak value of the erase voltage is increased for each subsequent pulse (e.g., in 1V increments from 16V to 20V).

FIG. 8C depicts one embodiment of an erase operation with erase verify that may be used for 2D NAND. In step 870, the system initializes $V_{ERASE}$. This refers to setting the magnitude of the erase pulse. In step 872, the system applies the erase pulse, along with other erase conditions to the group of NAND strings being erased. As noted above, the erase pulse can be applied to the p-well. Other erase conditions may include applying 0 volts to the word lines of a selected block while the source and bit lines are floating. Note that these are just one example of erase conditions. A voltage other than 0V could be applied to the word lines. Also, it is not required that each word line receive the same voltage. Furthermore, for some devices the source and bit lines might not be floating. Note that step 870 could be performed more than once prior to going on to step 874. One example of this is depicted in FIG. 8A in which several erase pulses are depicted prior to the first erase verify. Note that step 872 is one embodiment of step 802 from FIG. 8B.

In step 874, the system performs an erase verify at the strict erase verify reference level. The erase verify may be performed on a NAND string basis. Briefly, this may include applying a suitable voltage to the bit lines and common source line that allows a NAND string to conduct. Also, a reference voltage is applied to the word lines. If a given memory cell has a threshold voltage that is below the strict erase verify reference level then it should turn on and could conduct a current. If all memory cells on a given NAND string turn on, then the NAND string will conduct a significant current. The system (e.g., sense block 500) tests for whether this current is greater than a demarcation current in one embodiment. Note that step 874 is one embodiment of step 804 from FIG. 8B.

Figure 9A:
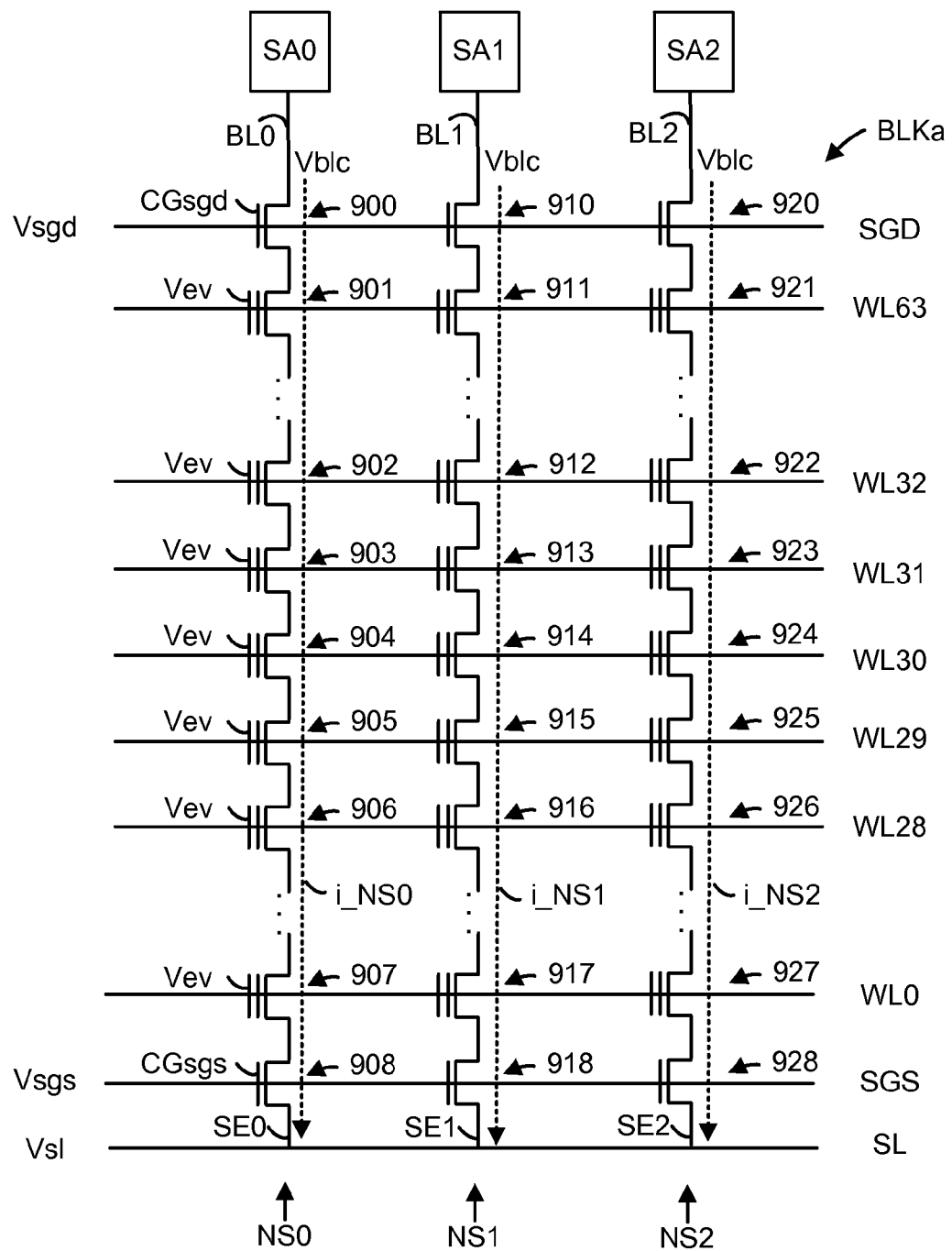
FIG. 9A depicts current flow in NAND strings during an example all bit line sensing process of an erase operation.
Figure 9B:
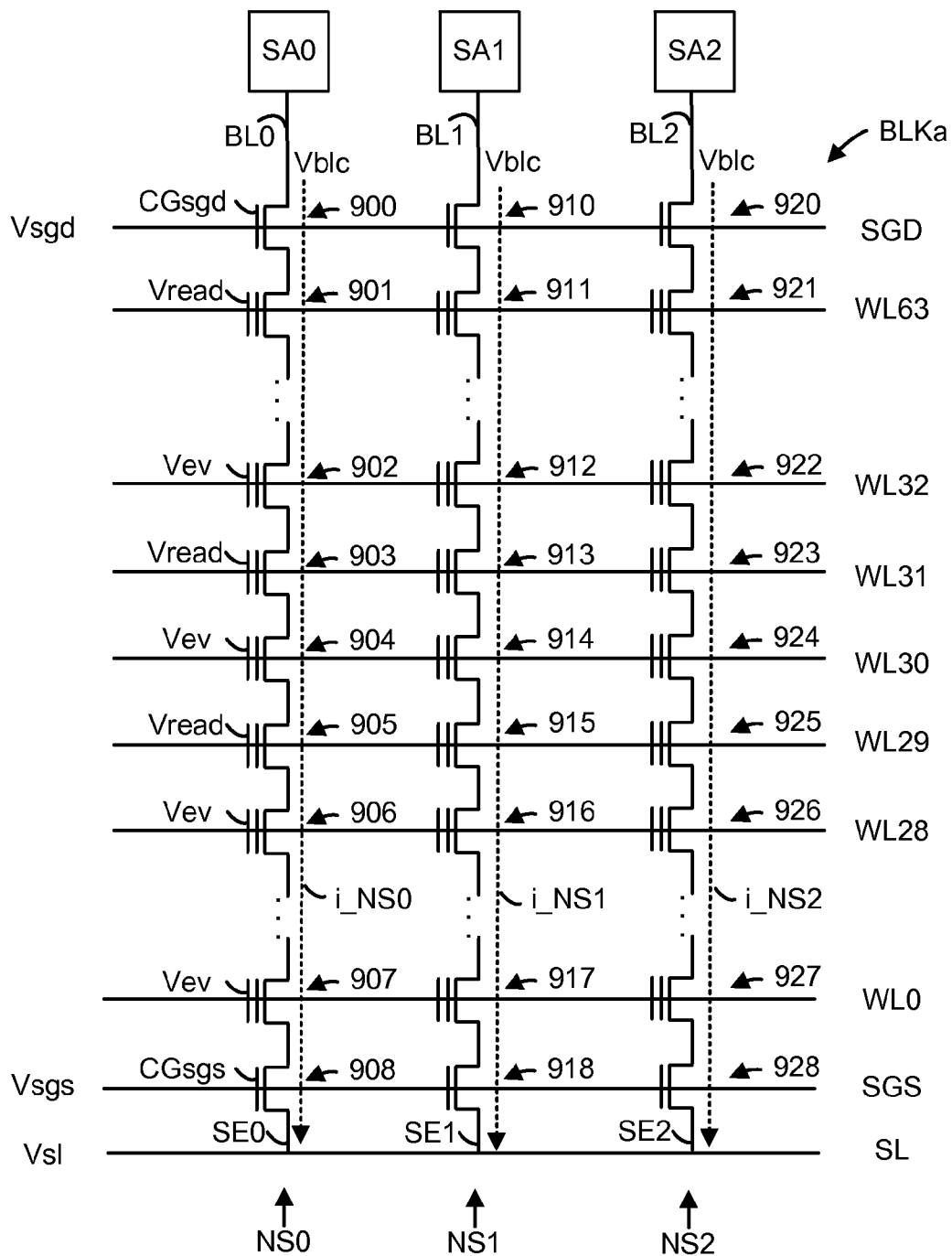
FIG. 9B depicts an example in which the erase-verify test is performed concurrently for storage elements associated with only the even word lines.
Figure 9C:
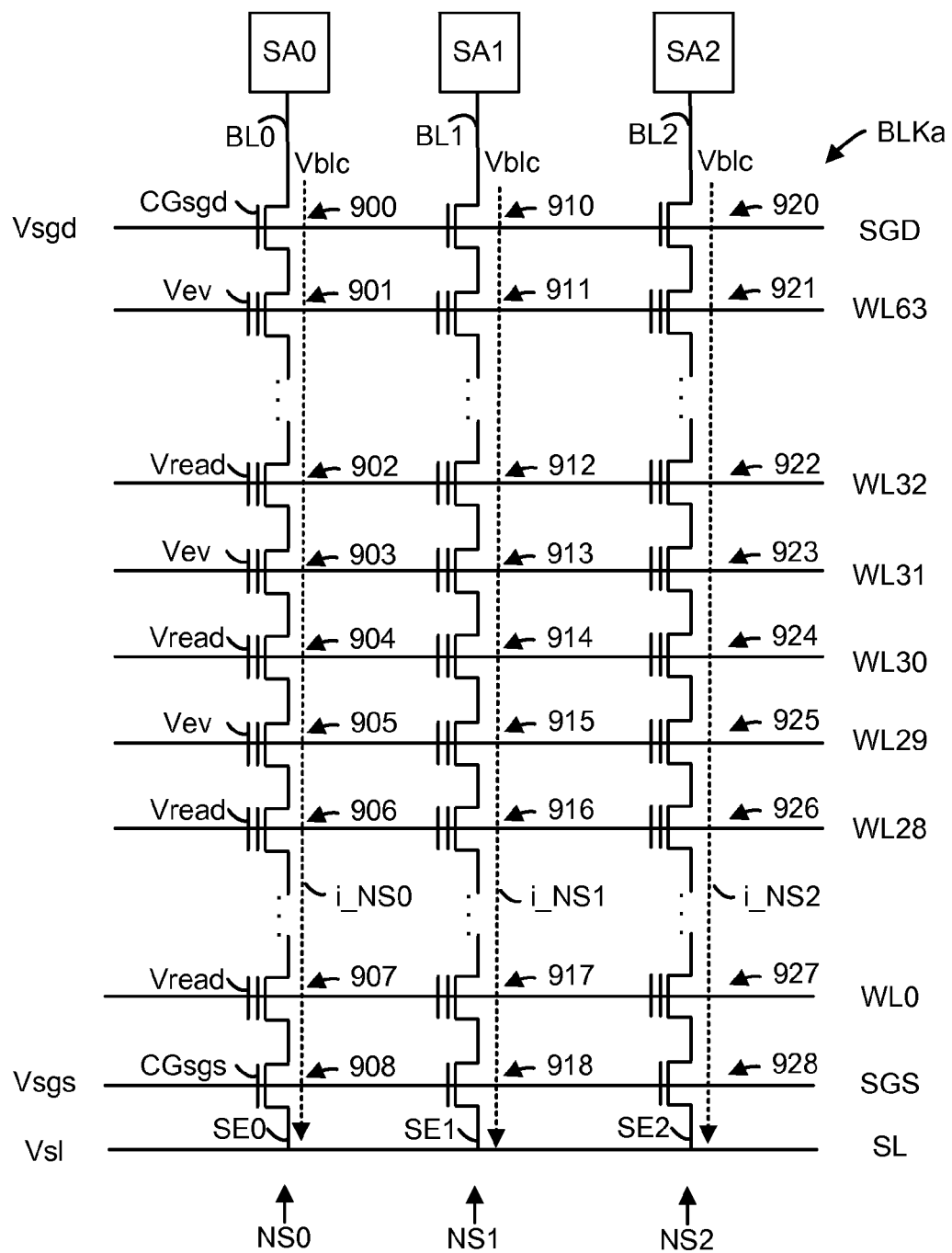
FIG. 9C depicts an example in which the erase-verify test is performed concurrently for storage elements associated with only the odd word lines.

There are numerous options for the erase verify test of step 874. FIGS. 9A-9C show several different embodiments. Briefly, in FIG. 9A memory cells associated with all word lines are verified concurrently. In FIG. 9B, the erase-verify test is performed concurrently for storage elements associated with only the even word lines. In FIG. 9C, the erase-verify test is performed concurrently for storage elements associated with only the odd word lines.

FIG. 9A depicts current flow in NAND strings during an example all bit line sensing process of an erase operation. BLKa includes example NAND strings NS0-NS2 and associated sense amplifiers SA0-SA2, respectively, connected to bit lines BL0-BL2, respectively. An SGD line is connected to control gates of SGD transistors 900 (having example control gate CGsgd), 910 and 920. WL63 is connected to control gates of storage elements 901 (having example control gate CG63), 911 and 921. WL32 is connected to control gates of storage elements 902 (having example control gate CG32), 912 and 922. WL31 is connected to control gates of storage elements 903 (having example control gate CG31), 913 and 923. WL30 is connected to control gates of storage elements 904 (having example control gate CG30), 914 and 924. WL29 is connected to control gates of storage elements 905 (having example control gate CG29), 915 and 925. WL28 is connected to control gates of storage elements 906 (having example control gate CG28), 916 and 926. WL0 is connected to control gates of storage elements 907 (having example control gate CG0), 917 and 927. An SGS line is connected to control gates of SGS transistors 908 (having example control gate CGsgs), 918 and 928. The source ends SE0-SE2 of NS0-NS2, respectively, are connected to a common source line SL.

The sensing can be used to determine whether an erase operation is completed for the block BLKa. The voltage applied to the bit lines (Vblc) is larger than the voltage applied to the common source line (Vsl). This permits a current to conduct in the depicted direction in the NAND string (bit line to source line), assuming that the memory cells on the NAND string conduct in response to the voltage on their control gates. The current in NS0, NS1 and NS2 is i_NS0, i_NS1 and i_NS2, respectively, as sensed by sense amplifiers SA0, SA1 and SA2, respectively.

If the sensed current exceeds a threshold or trip level (Itrip), the NAND string is judged to be in a conductive state, in one embodiment. If the sensed current does not exceed the trip level, the NAND string is judged to be in a non-conductive state. The value of Itrip may be determined by a sensing time (tsense) which can be set based on a ROM fuse parameter in the memory device. In one approach, Isense is inversely proportional to tsense.

The voltage applied to the word lines (Vev) would be associated with the strict erase verify level in this example. However, note that a positive voltage may be applied to the common source line. Thus, Vsl may be a positive voltage. That same positive voltage may also be applied to the p-well. Applying a positive voltage to the common source line allows a non-negative voltage to be applied to the control gates of memory cells in order to test for a negative threshold voltage. Note that this sensing technique is not a requirement. For example, a negative voltage could be applied to the control gates of memory cells. However, for some memory devices it is not convenient to generate negative voltages.

Note that the erase verify reference level can be controlled by setting Vsl. A higher Vsl makes the erase-verify test stricter (e.g., tests for a lower threshold voltage). Thus, modifying Vsl can effectively be used to select either $V_{EV\_STRICT}$ or $V_{EV\_NORM}$ in FIG. 7B. Note that the voltage applied to the control gates of memory cells can also be used to achieve the desired erase verify reference level. Thus, in FIG. 9A, Vsl and/or Vev may be adjusted to achieve the desired erase verify reference level.

FIG. 9B depicts an example in which the erase-verify test is performed concurrently for storage elements associated with only the even word lines. This case differs from the example in FIG. 9A in that Vread is applied to the odd word lines. Vread is a voltage that should cause the memory cell to turn on even if its threshold voltage is above the erase verify level being tested for.

FIG. 9C depicts an example in which the erase-verify test is performed concurrently for storage elements associated with only the odd word lines. This case differs from the example in FIG. 9A in that Vread is applied to the even word lines. The system can separately track whether erase verify passes for even/odd word lines such that a NAND string passes erase verify once memory cells associated with both the even and odd word lines pass. The conditions in FIGS. 9A-9C are several embodiments of step 808 of FIG. 8B.

The system determines whether the strict erase-verify test passed in step 876. Passing is defined by less than a certain number of NAND strings failing erase verify, in one embodiment. Thus, an erase-verify test is judged to be passed when all, or almost all of the NAND strings (except for a small number of NAND strings which might be ignored), are judged to be in a conductive state.

FIG. 9D depicts curves when sensing a current for the sensing scheme of FIGS. 9A-9C. The bit line voltage may be held constant during sensing. In one embodiment, the NAND string current discharges a sense node in the sense amplifier for a time period referred to as a "sense time." A determination is made whether the voltage on the sense node discharges to a certain level within the sense time. The sense node may have a known capacitance (C), such that the NAND string current can be determined by I=C dV/dt. In this equation, I is the NAND string current, dV is the drop in voltage on the sense node, and dt is the sense time. Thus, a greater NAND string current can be tested for by either increasing dV or by decreasing the sense time (dt).

FIG. 9D depicts the voltage (V) at the sense node (Sense Node) versus sense time. A line 950 represents a case where the NAND string is in a conductive state and a relatively large current flows. Thus, the voltage at the sense node discharges by a large amount. A line 956 represents a case where the NAND string is in a non-conductive state and a relatively small current flows. Each case starts with V_cap on the sense node at about time t0. The voltage on the sense node needs to drop to dV_trip to reach the demarcation point. The difference between these two voltages is dV in the above equation. If the voltage reaches or falls past this demarcation point by the sense time (tsense), then the NAND string current is at least "I_sense."

If erase verify passes at the strict erase verify reference level (step 876=true), then the process concludes at step 892. Otherwise, the process goes to step 878. In step 878, the system notes which NAND strings passed the strict erase verify and which NAND strings did not pass the strict erase verify. This might be noted by storing a bit in a register or latch. For example, a latch in the sense block 500 might store the result of erase verify.

In step, 880, the system sets up conditions for current saving during the next erase verify that will be performed at the target erase verify reference level. In one embodiment, this includes applying the same voltage to the bit lines for locked out NAND strings that is applied to the common source line. In one embodiment, this includes applying the a slightly greater voltage to the bit lines for NAND strings that are not locked out that is applied to the common source line. In one embodiment, the system locks out NAND strings that were noted as passing erase verify in step 878. In one embodiment, the system also locks out memory cells that passed a previous iteration of a nominal erase verify in step 882.

Figure 9E:
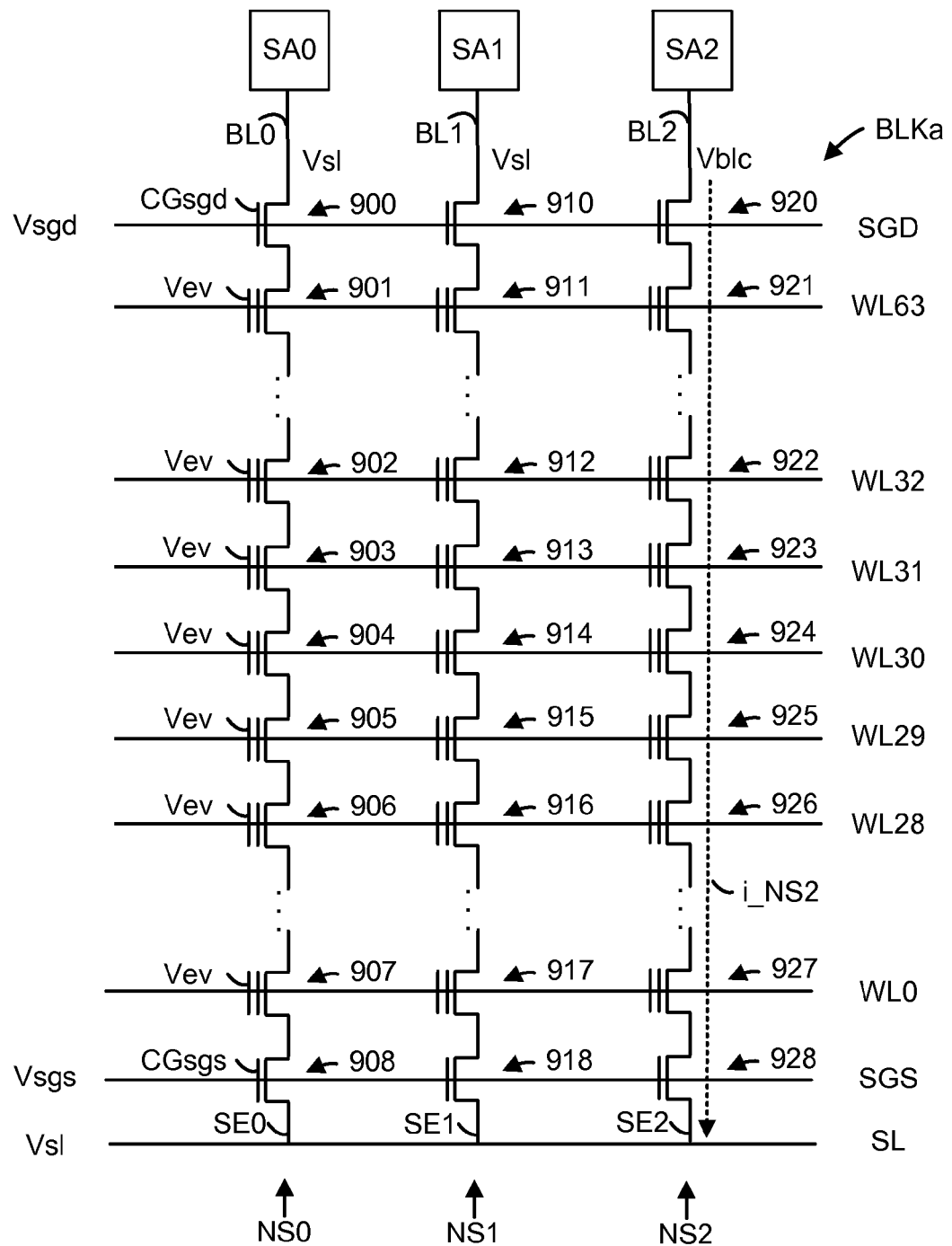
FIG. 9E depicts conditions for one embodiment of setting up conditions for reducing current and/or power during erase verify.

FIG. 9E depicts conditions for one embodiment of setting up conditions for reducing current and/or power during erase verify. This corresponds to the example of FIG. 9A in which memory cells associated with all word lines are being verified concurrently. The conditions in FIG. 9E is one embodiment of step 806 of FIG. 8B. A difference between these conditions and those of FIG. 9A is that the same voltage is applied to locked out bit lines as is applied to the common source line (e.g., Vsl). Thus, Vsl is applied to bit lines BL0 and BL1, which are locked out because their associated NAND strings passed erase verify at the strict erase verify reference level. Note that no current is depicted as passing through those locked out NAND strings. However, current i_NS2 is depicted as passing through NAND string NS2. This refers to the current that potentially flows through NS2, depending on whether the memory cells turn on in response to the control gate voltage.

The voltage Vsl that is applied to the source line may have a different magnitude than the voltage that is applied to the source line when sensing at the strict erase verify level. For example, both cases could use 0V for Vev to the word lines. However, Vsl might be a larger voltage for the strict erase verify than for the nominal erase verify in order to sense for a more negative threshold voltage. Note that the voltage to the word lines could be greater than 0V or less than 0V when performing nominal erase verify. This holds true for strict erase verify, as well.

Applying the voltages to the bit lines may be achieved by charging the bit lines using circuitry in the sense block 500. Thus, step 880 may include applying a first voltage (e.g., Vsl) to the common source line, charging the first set of bit lines to the first voltage (e.g., Vsl), and charging the second set of bit lines to a second voltage (e.g., Vblc) that is greater than the first voltage applied to the common source line.

FIG. 9E shows one embodiment in which both even and odd word lines are verified concurrently. Another option is to verify memory cells associated with odd word lines separately from those associated with even word lines, as in the examples of FIGS. 9B and 9C. Thus, the examples of FIGS. 9B and 9C can be modified by applying suitable bit line voltages, as shown in FIG. 9E for a current saving mode.

In step 882, the system performs a nominal erase verify test. This may include sensing a current of the NAND strings that are not locked out. Referring to FIG. 9E, the current through BL2 associated with NAND string NS 2 may be sensed. Note that since NAND strings NS0 and NS1 are locked out, sensing is not performed in sense amplifiers SA0 and SA1. Moreover, since NAND strings NS0 and NS1 are locked out, little or no current is conducted for those NAND strings. Therefore, the current (and power) consumption during this erase verify sensing operation is reduced. Step 882 is one embodiment of step 810 from FIG. 8B.

In step 883, the system notes which memory cells passed erase verify at the nominal level. These memory cells can be locked out in the next iteration of steps 880-882, along with the memory cells that passed the strict erase verify.

In step 884, the system determines whether the nominal (target) erase verify passed. In one embodiment, the erase verify is performed on a NAND string basis. As noted above, erase verify can be performed separately for even and odd word lines (see FIGS. 9B, 9C, with modifications to bit line voltages noted above). If erase verify passes at the target erase verify reference level, then the process concludes are step 892. Note that a certain number of NAND strings may be permitted to fail erase verify with the erase process still passes.

If the erase verify procedure is not yet complete (step 884=false), then the process goes to step 886 to determine whether the erase process is permitted to continue onward. The system may compare the magnitude of the last erase pulse with a permitted maximum, the total number of erase pulses applied, or some other criterion. As one example, if the magnitude of $V_{ERASE}$ is not less than or equal to a maximum allowed erase pulse (e.g., $V_{ERASE\_MAX}$), then the process concludes at step 890 with the erase operation failing.

If the system determines that the erase procedure can proceed (step 886=true), then the magnitude of the erase pulse is stepped up in step 888. The procedure then returns to step 872 to apply the erase pulse and other erase conditions again. Note that it is not a requirement that the magnitude of the erase pulse be stepped up with each loop of the process. Thus, instead of stepping up the magnitude of the erase pulse in step 888, the erase pulse magnitude might be kept the same or even reduced.

In 2D NAND memory devices, the p-well substrate is biased at a high voltage to erase the storage elements, in one embodiment. Note that the 2D NAND strings are typically formed in the substrate, such that by applying the erase voltage to the substrate while, for example, grounding the control gates, the memory cells can be erased. In contrast, vertically-oriented NAND strings in a 3D stacked non-volatile memory device, such as BiCS, are typically not formed in a substrate.

One approach to erasing in a 3D stacked non-volatile memory device is to generate gate induced drain leakage (GIDL) current to charge up the NAND string channel, raise the channel potential to an erase voltage, and maintain this channel potential during erase. In one approach, the memory device includes NAND strings which have a drain-side select gate (SGD) transistor on one end and a source-side select gate (SGS) transistor on the other end. The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

FIG. 10A is a perspective view of a 3D stacked non-volatile memory device. The memory device 2100 includes a substrate 2101. On the substrate are example blocks BLK0 and BLK1 of memory cells and a peripheral area 104 with circuitry for use by the blocks. The substrate 2101 can also carry circuitry under the blocks, along with one or more lower metal layers which are patterned in conductive paths to carry signals of the circuitry. The blocks are formed in an intermediate region 2102 of the memory device. In an upper region 2103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted. The x-axis may also be referred to as a word line (WL) direction. The v-axis may also be referred to as a bit line (BL) direction. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

In one embodiment, NAND strings have a U-shape. In another embodiment, NAND strings have a straight shape. FIG. 10B depicts an embodiment of block which includes U-shaped NAND strings. The block BLK0A includes U-shaped NAND strings arranged in sets (SetA0, . . . , SetAn, where there are n+1 sets of NAND strings in a block). Each set of NAND strings is associated with one bit line (BLA0, BLA1, BLA2, BLA3, BLAn). In one embodiment, each NAND string has a drain side select gate that is able to connect/disconnect the NAND string from its bit line. The drain side select gates in a set of NAND strings may be individually selectable, such that one NAND string in the set may be selected at a given time. In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

Figure 10C:
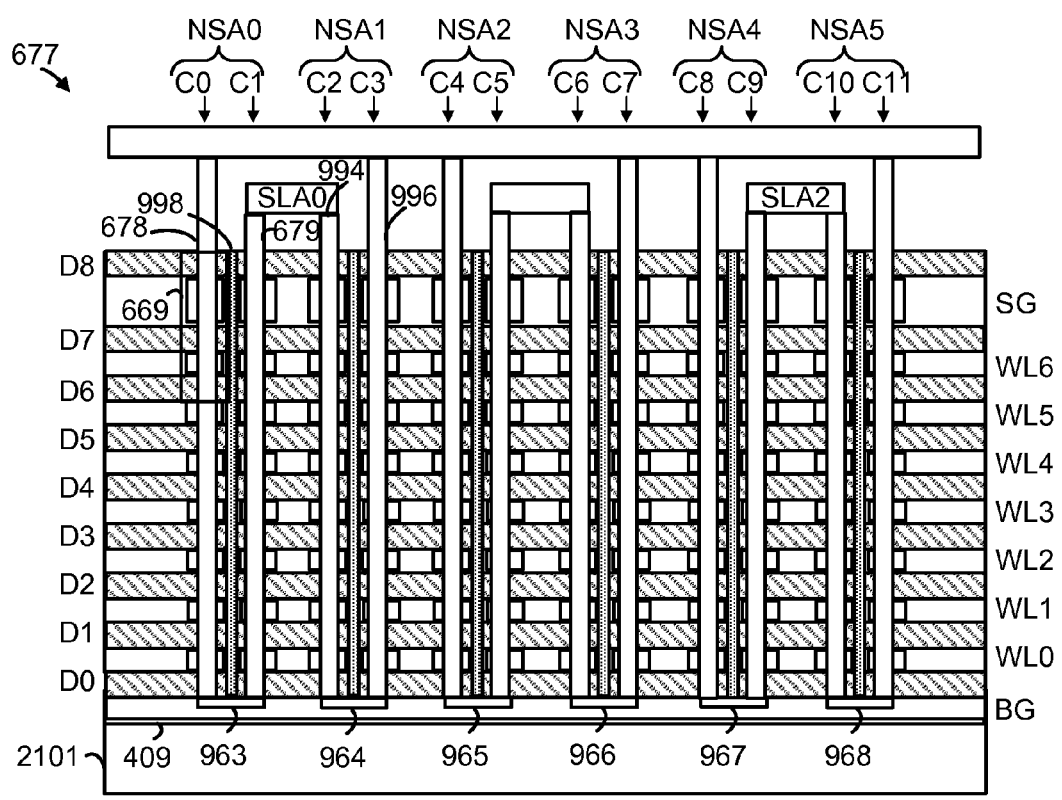
FIG. 10C depicts a cross-sectional view of a block of the 3D non-volatile memory device of FIG. 10B.

FIG. 10C depicts a cross-sectional view of a block of the 3D non-volatile memory device of FIG. 10B of SetA0 of NAND strings of FIG. 10B. Columns of memory cells C0 to C11 are depicted in the multi-layer stack, having layers BG, WL0-WL6, BG, and D0-D8. The stack 677 includes the substrate 2101, an insulating film 409 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 963 to 968 which connect the columns. The back gate thus connects the two columns of each U-shaped NAND string. For example, NSA0 includes columns C0 and C1 and connecting portion 963. NSA0 has a drain end 678 and a source end 679. NSA1 includes columns C2 and C3 and connecting portion 964. NSA1 has a drain end 996 and a source end 994. NSA2 includes columns C4 and C5 and connecting portion 965. NSA3 includes columns C6 and C7 and connecting portion 966. NSA4 includes columns C8 and C9 and connecting portion 967. NSA5 includes columns C10 and C11 and connecting portion 968. A region 699 is highlighted.

The source line SLA0 is connected to the source ends 679 and 994 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 677 extend behind the U-shaped NAND strings depicted in the cross-section, e.g., along the x-axis. The U-shaped NAND strings NSA0 to NSA5 are each in a different sub-block, but are in a common set of NAND strings (SetA0).

A slit portion 998 is also depicted as an example. In the cross-section, multiple slit portions are seen, where each slit portion is between the drain- and source-side columns of a U-shaped NAND string. Portions of the source lines SLA0, SLAT, SLA2 are also depicted. A portion of the bit line BLA0 is also depicted.

Thus, FIG. 10C shows strings (e.g., NAND strings) of non-volatile storage elements formed above the substrate 2101 in multiple physical levels of a three-dimensional memory array. Each of the strings has an active area comprising a channel that extends vertically through the physical levels. Each string comprises non-volatile storage elements and a drain side select gate in the SG layer.

Figure 10D:
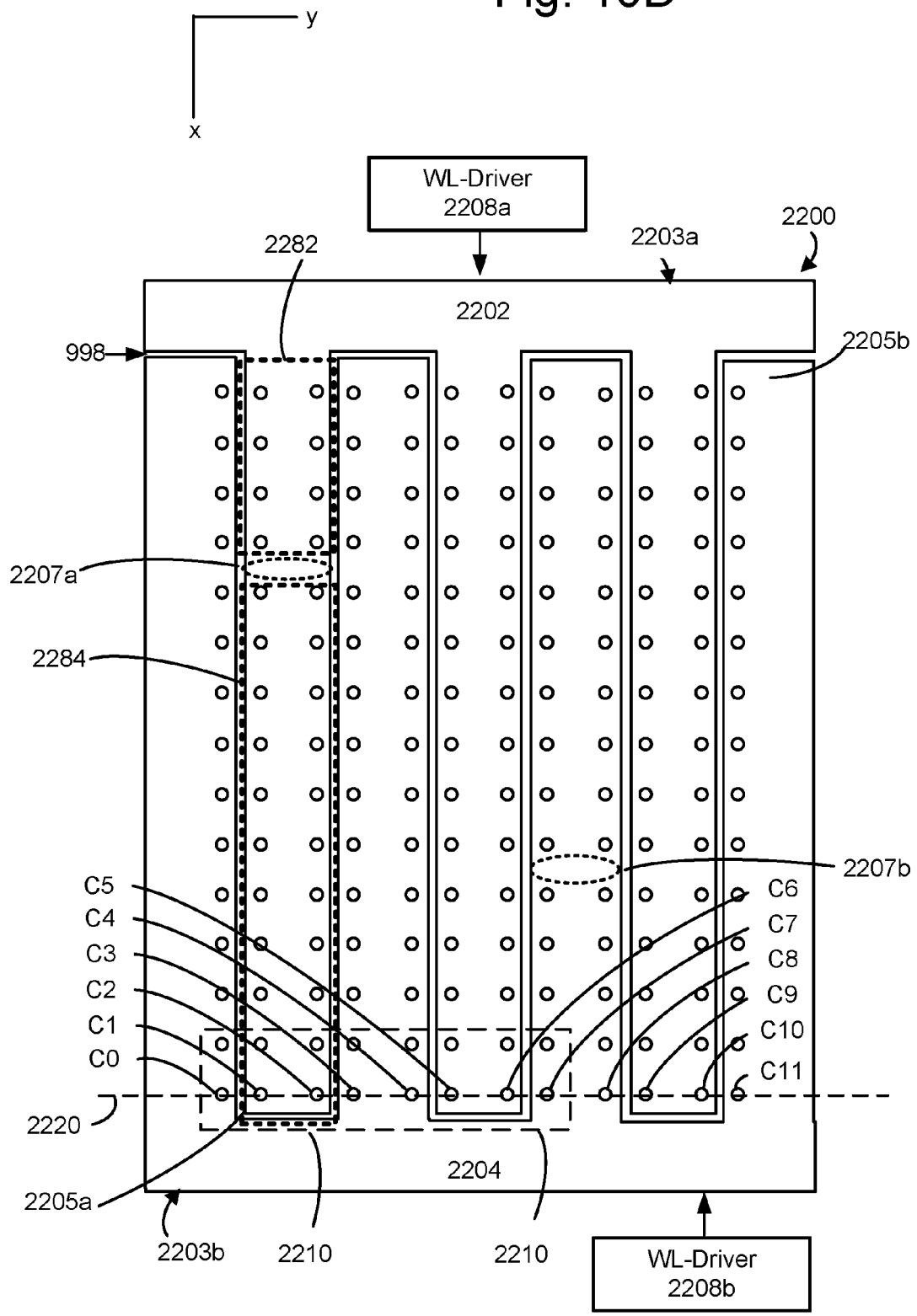
FIG. 10D is a top view a U-shaped NAND embodiment of one layer of a block, as an example implementation of BLK0 in FIG. 10A.

FIG. 10D is a top view a U-shaped NAND embodiment of one layer of a block 2200, as an example implementation of BLK0 in FIG. 10A. The view is of a representative layer among the multiple word line layers in a stack. For each block 2200, the word line layer is divided into two word lines 2202 and 2204, in one embodiment. Each block includes a slit pattern, in one embodiment. A slit refers, e.g., to a void which extends vertically in the stack, typically from an etch stop layer at the bottom to at least a top layer of the stack. The slit can be filled with insulation to insulate words lines from one another. A slit 998 may be a single continuous slit which extends in a zig-zag pattern in the block so that the block is divided into two word lines 2202 and 2204, which are insulated from one another. This approach can provide greater flexibility in controlling the memory cells since the word lines can be driven independently.

Each block includes rows of columnar, e.g., vertical, memory holes or pillars, represented by circles in FIG. 10D. Each row represents a vertical group of columns in the figure. The memory holes extend vertically in the stack and include memory cells such as in a vertical NAND string. Example columns of memory cells along a line 2220 include C0 to C11. A region containing columns C0-C7 is highlighted and labeled with reference character 2210. FIG. 10D represents a simplification, as many more rows of memory holes may be used. Also, the figures are not necessarily to scale. The columns of memory cells can be arranged in subsets or sub-blocks.

Word line driver 2208a provides voltages to word line 2202. Word line driver 2208b provides voltages to word line 2204. Specifically, word line driver 2208a is electrically connected to WL-driver end 2203a of word line 2202. Word line 2202 has a comb shape in this example, with three "fingers". Each of the fingers extends away from the word line driver 2208a. The tip of the fingers are far away from the word line driver 2208a. A far end 2205a of the word line 2202 is labeled (with reference number 2205a) for one of the fingers. Note that some memory cells associated with word line 2202 are close to the word line driver 2208a and some are far from the word line driver 2208a. An intermediate point 2207a between the WL-driver end 2203a and the far end 2205a is circled for one finger of word line 2202.

Word line 2202 has a first physical segment 2284 that extends between the WL-driver end 2203a and the intermediate point 2207a. Word line 2202 has a second physical segment 2284 that extends between the intermediate point 2207a and far end 2205a. Note that a first group of memory cells associated with the first physical segment 2282 of word line 2202 are close to the word line driver 2208a and a second group of memory cells associated with the second physical segment 2284 of word line 2202 are farther from the word line driver 2208a.

Similarly, word line driver 2208b is electrically connected to one end of word line 2204. Note that some memory cells of word line 2204 are close to the word line driver 2208b and some are far from the word line driver 2208b. A far end 2205b of the word line 2204 is labeled (with reference number 2205b) for one of the fingers. Note that some memory cells associated with word line 2204 are close to the word line driver 2208b and some are far from the word line driver 2208b. An intermediate point 2207b between the WL-driver end 2203b and the far end 2205b is circled for one finger of word line 2204. The distance from the word line driver can have an impact on the waveform received at the memory cell, as will be discussed below. For example, RC delays can impact a voltage waveform.

Note that the word line drivers 2208 are not necessarily in the same layer of the stack as the word lines 2202, 2204. Rather, the word line drivers 2208 may be in a different layer, with a vertical conductive connection between the driver 2208 and the word line. Example vertical connections are discussed below with respect to FIG. 10G.

The drawings are not to scale and do not show all memory columns. For example, a block might have 12 memory columns in the y direction as shown, but a very large number such as 32k memory columns in the x direction, for a total of 384k memory columns in a block. With U-shaped NAND strings, 192k NAND strings are provided in this example. With straight NAND strings, 384k NAND strings are provided in this example. Assume there are four memory cells per column, so there are 384k×4=1,536k or 1,536,000 total cells in the set.

FIG. 10E depicts a top view of a straight NAND string embodiment of the block BLK0 of FIG. 10A. In this configuration, a NAND string has only one column, and the source-side select gate is on the bottom of the column instead of on the top, as in a U-shaped NAND string. Moreover, a given level of a block has one word line which is connected to each of the memory cells of the layer. A number of slits, such as example slit 2383, can also be used. These insulation-filled slits are used in the fabrication process to provide structural support for the stack when undoped polysilicon layers are removed by a wet etch and a dielectric is deposited to form the alternating dielectric layers. A dashed line 2386 extends through columns C12 to C17. A cross-sectional view along line 2386 of portion 2388 is shown in FIG. 10F.

In this example, there is a single word line driver 2208c electrically connected to a WL-driver end 2203c of the word line 2380. A far end 2205c of the word line 2202 is shown. An intermediate point 2207c between the WL-driver end 2203c and the far end 2205c is depicted. The word line has a first physical segment 2382 that extends between the WL-driver end 2203c and the intermediate point 2207c. The word line has a second physical segment 2384 that extends between the intermediate point 2207c and far end 2205c. Note that a first group of memory cells associated with the first physical segment 2382 of the word line 2380 are close to the word line driver 2208c and a second group of memory cells associated with the second physical segment 2384 of the word line 2380 are farther from the word line driver 2208c.

Thus, some memory cells are closer to the word line driver 2208c and some are farther from the word line driver 2208c. However, there could be a word line driver 2208 at each end of the word line 2308 with just one of the word line drivers being used at a time.

FIG. 10F depicts a cross-sectional view of the portion 2388 of the block of FIG. 10E along line 2386. Columns of memory cells corresponding to NAND strings NS8 to NS11 are depicted in the multi-layer stack, including layers SGSA, WL0A-WL3A, SGDA, and D0A-D6A. The stack 2302 includes a substrate 2101, an insulating film 2250 on the substrate, and a portion of a source line SL0A. Additional straight NAND strings in a SGD line subset may extend in front of and in back of the NAND strings depicted in the cross-section, e.g., along the x-axis. NS8 has a source end 2394 and a drain end 2392. The slit 2383 from FIG. 10E is also depicted with other slits. A portion of the bit lines BL0A8-BL0A11 are also depicted. Dashed lines depict memory cells and select gate transistors. In the embodiment of FIG. 10F, a NAND string has a single drain side select transistor. In one embodiment, a straight NAND string has two drain side select transistors.

Figure 10G:
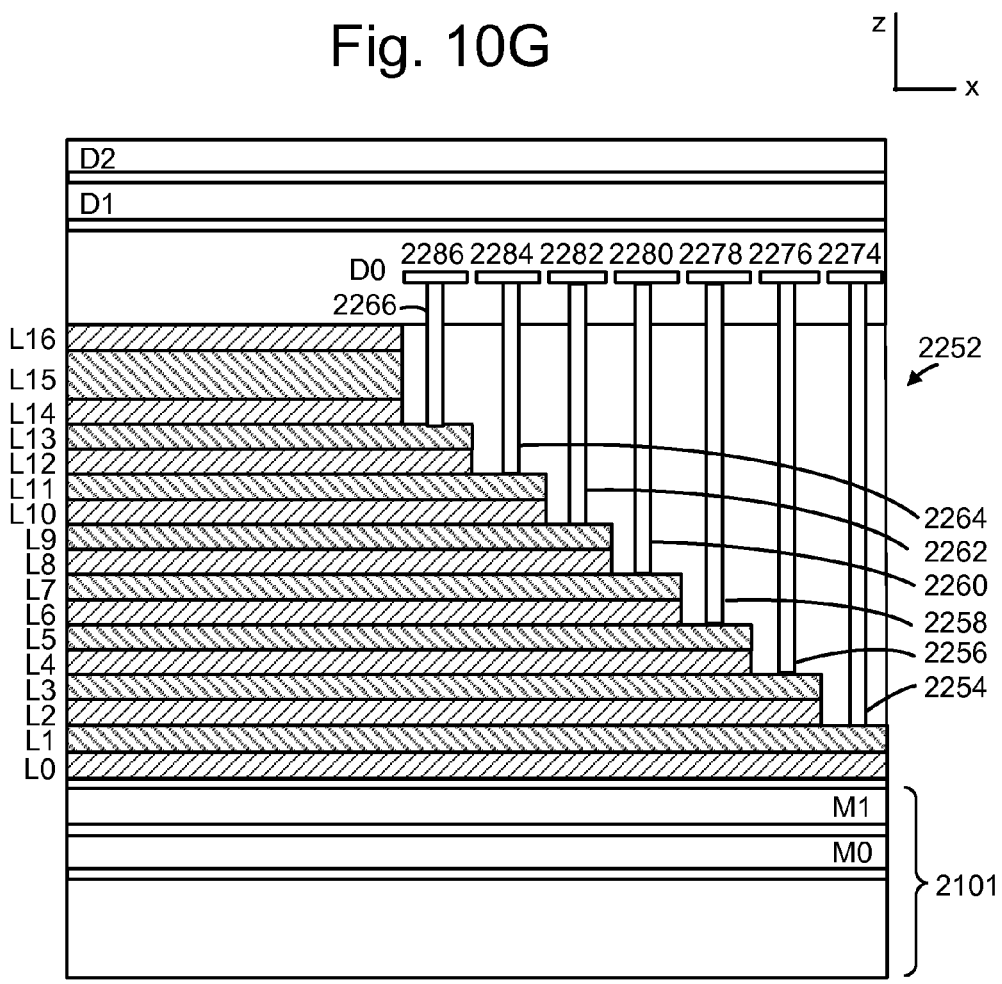
FIG. 10G depicts contact structures to word lines.

In one embodiment, the 3D stacked memory array has a terraced structure to allow electrical contact to an end of the word lines. FIG. 10G depicts contact structures of the terraced portion 2252. Contact structures 2254, 2256, 2258, 2260, 2262, 2264 and 2266 extend upward from L1, L3, L5, L7, L9, L11 and L13, respectively, to portions 2274, 2276, 2278, 2280, 2282, 2284 and 2286, respectively, of an upper metal layer D0. The contact structures and upper portions are one example of electrical contacts to word lines. The word lines are at layers from L1, L3, L5, L7, L9, L11 and L13, in this example. Therefore, voltages can be provided (from, for example, a word line driver) to one end of a word line. Depending on the architecture, there could be another set of electrical contacts on the opposite side of the word line layers (in the x-direction). D1 and D2 are example additional upper metal layers above D0. A substrate region 2101 having two metal layers M0 and M1 is depicted. Referring back to FIGS. 10D and 10E, the word line drivers 2208 can provide voltages to the word lines though the contact structures 2254, 2256, 2258, 2260, 2262, 2264 and 2266.

Figure 11A:
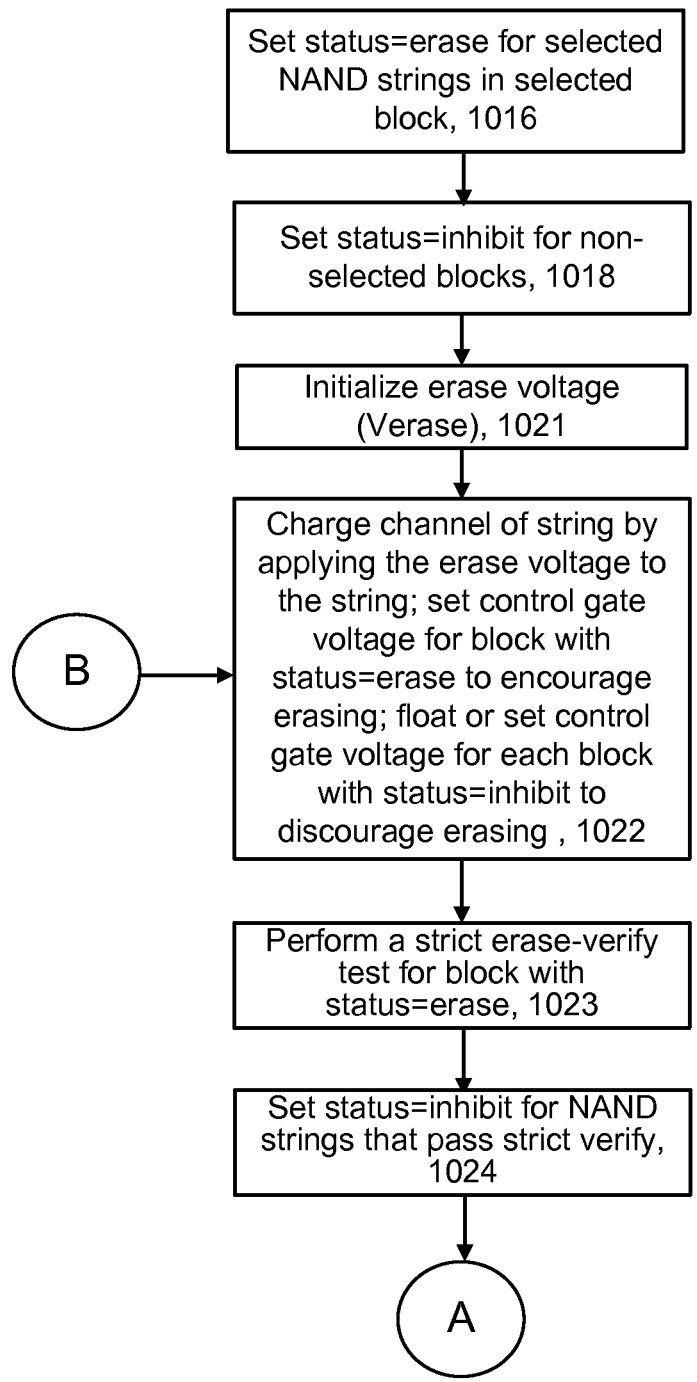

FIGS. 11A and 11B depict a flowchart of one embodiment of a process of performing an erase operation in 3D NAND having an erase verify. Generally, an erase operation can include multiple erase-verify iterations which are performed until a verify condition is met, at which point the erase operation ends. Optionally, one or more additional erase voltages can be applied after erase verify has passed. In one approach, the memory device includes NAND strings which have a drain-side select gate (SGD) transistor on one end and a source-side select gate (SGS) transistor on the other end (see FIGS. 10C and 10F). The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

In step 1016, the system sets status=erase for the storage elements on the selected NAND strings that are in the selected block.

In step 1018, the system sets status=inhibit for the storage elements in the unselected blocks.

In step 1021, the system initializes an erase voltage ($V_{ERASE}$) to a starting value.

In step 1022, the system charges the channel of the 3D NAND string by applying the erase voltage to the NAND string, setting a control gate voltage for each storage element with status=erase to encourage erasing, and floating or setting a control gate voltage for each storage element with status=inhibit to discourage erasing. For example, a control gate voltage at a relatively high level (e.g., 10-15 V) discourages erasing by creating a small potential difference across the tunneling layer.

A control gate voltage at or slightly above, for example, 0 V encourages erasing by creating a large potential difference across the tunneling layer, between the channel and the control gate, which encourages further tunneling. Step 1022 is one embodiment of step 802 from FIG. 8B.

In step 1023, the system performs a strict erase-verify test for storage elements in the selected block (for the selected NAND string). The strict erase-verify test can be performed concurrently for the different storage elements on the NAND string. For example, this can involve applying a common erase-verify control gate voltage to the control gate of each storage element in the selected block while detecting the current through the string. In one embodiment, the strict erase-verify test for 3D NAND is similar to that of 2D NAND. The conditions used in any of FIGS. 9A-9C could be used.

If the current of the 3D NAND string is above a reference current, indicating the NAND string is conductive, the strict erase-verify test is passed. In optional step 1024, the system sets status=inhibited for NAND strings that pass the strict erase verify test. The process then goes to "A", which denotes that step 1076 of FIG. 11 is next.

In step 1076, the system determines whether the strict erase-verify test passed. Passing is defined by less than a certain number of NAND strings failing erase verify, in one embodiment. Thus, an erase-verify test is judged to be passed when all, or almost all of the NAND strings (except for a small number of NAND strings which might be ignored), are judged to be in a conductive state.

Sensing during erase verify for 3D NAND may be similar to the example of sensing during erase verify of 2D NAND. The bit line voltage may be held constant during sensing. In one embodiment, the 3D NAND string current discharges a sense node in the sense amplifier for a time period referred to as a "sense time." A determination is made whether the voltage on the sense node discharges to a certain level within the sense time.

If erase verify passes at the strict erase verify reference level (step 1076=true), then the process concludes at step 1092. Otherwise, the process goes to step 1078.

In step 1078, the system notes which 3D NAND strings passed the strict erase verify and which 3D NAND strings did not pass the strict erase verify. This might be noted by storing a bit in a register or latch. For example, a latch in the sense block 500 might store the result of erase verify.

In step, 1080, the system sets up conditions for current saving during the next erase verify that will be performed at the target erase verify reference level. This can be performed in a similar manner as the 2D NAND example discussed above. In one embodiment, step 1080 includes applying the same voltage to the bit lines for locked out 3D NAND strings that is applied to the common source line. In one embodiment, this includes applying the a slightly greater voltage to the bit lines for 3D NAND strings that are not locked out that is applied to the common source line. Conditions depicted in FIG. 9E depicts are used for one embodiment of step 1080.

In step 1082, the system performs a nominal erase verify test. This may include sensing a current of the 3D NAND strings that are not locked out. In optional step 1083, the system sets status=inhibited for NAND strings that pass the nominal erase verify test.

In step 1084, the system determines whether the nominal (target) erase verify passed. In one embodiment, the erase verify is performed on a NAND string basis. If erase verify passes at the target erase verify reference level, then the process concludes are step 1092. Note that a certain number of 3D NAND strings may be permitted to fail erase verify with the erase process still passes.

If the erase verify procedure is not yet complete (step 1084=false), then the process goes to step 1086 to determine whether the erase process is permitted to continue onward. The system may compare the magnitude of the last erase voltage with a permitted maximum, the total number of erase voltages applied, or some other criterion. As one example, if the magnitude of $V_{ERASE}$ is not less than or equal to a maximum allowed erase voltage (e.g., Verase_max), then the process concludes at step 1090 with the erase operation failing.

If the system determines that the erase procedure can proceed (step 1086=true), then the magnitude of the erase voltage is stepped up in step 1088. The procedure then returns to step 1022 (as indicated by "B") to charge the NAND string channel and apply other erase conditions again. Note that it is not a requirement that the magnitude of the erase voltage (applied to NAND string channel) be stepped up with each loop of the process. Thus, instead of stepping up the magnitude of the erase voltage in step 1088, the erase voltage magnitude might be kept the same or even reduced.

FIG. 11C shows a series of erase pulses 840 and erase verify reference levels 1110 that are used during one embodiment. FIG. 11C depicts an embodiment in which there is an erase pulse between the erase verify at the strict erase verify level (Strict EV) and the erase verify at the target erase verify level (target EV). This is an alternative to the embodiment of FIG. 8A. This shows that it is not a requirement that the nominal erase verify immediately follow the strict erase verify without any intervening erase conditions (e.g., EP3) being applied. Thus, one embodiment includes applying erase conditions (e.g., EP3) between determining a first set of NAND strings that were erased to the strict reference level and a second set of NAND strings that were not erased to the strict reference level and sensing the second set of the NAND strings during the erase verify at the target erase verify level. With such an embodiment, the magnitude of the strict erase verify reference level can be relaxed somewhat from the embodiment of FIG. 8A. For example, the strict erase verify in FIG. 11C could test for a higher threshold voltage compared to the strict erase verify reference level in FIG. 8A.

Figure 12A:
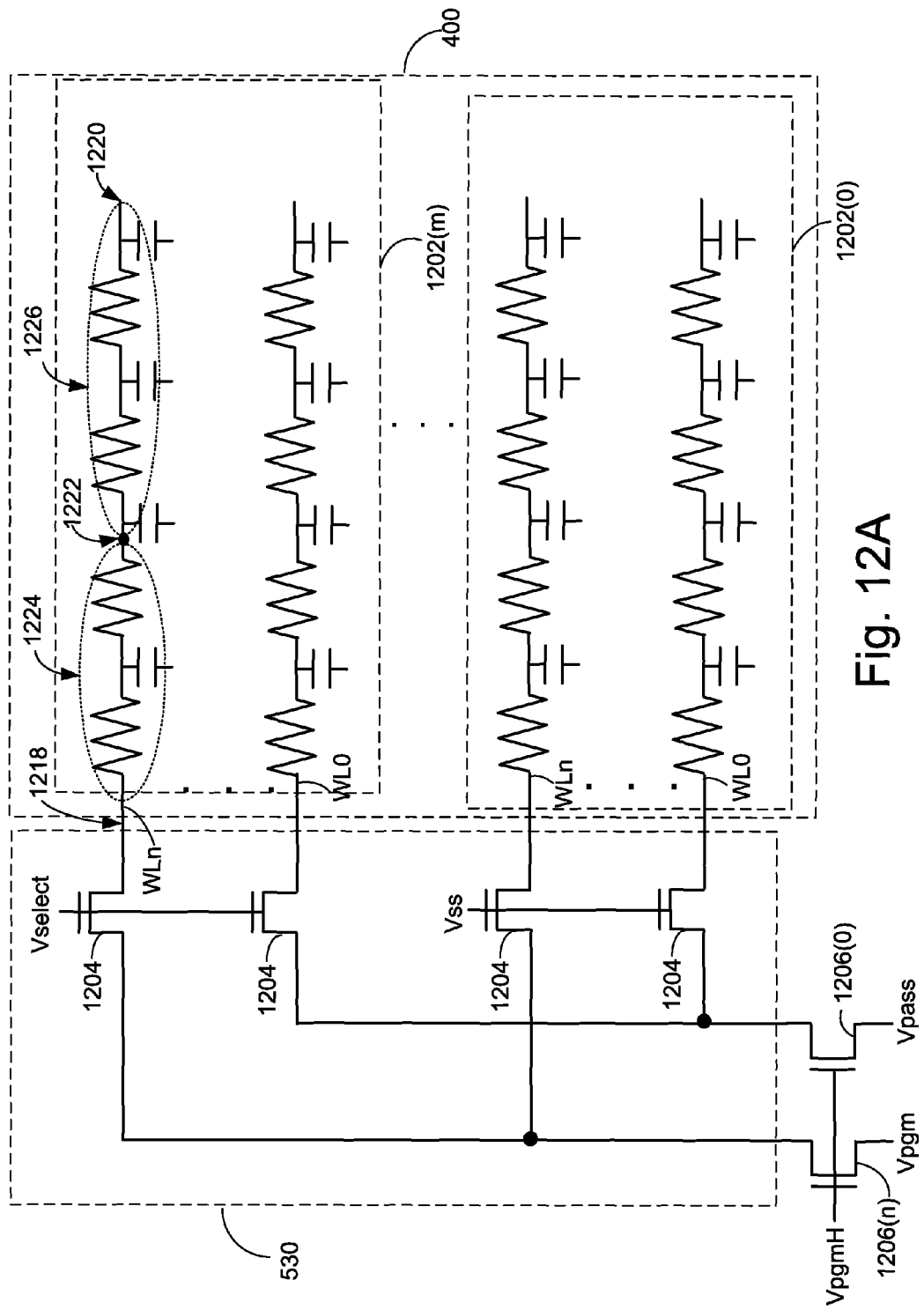
FIG. 12A depicts a schematic diagram of a portion of one embodiment of a memory array.

FIG. 12A depicts a schematic diagram of a portion of one embodiment of a memory array 400. FIG. 12A provides more details of one embodiment of the memory array 400 and associated row decoders 530. The memory array has blocks 1202(0)-1202(m). Two blocks are depicted in FIG. 12A, although there typically may be many more blocks 1202. The word lines (WL0 . . . WLn) in a block 1202 are modeled as having some resistance and some capacitance. The row decoders 530 include a block select transistor connected 1204 to each word line. The voltage Vselect is applied to each block select transistor 1204 in block 1202(m) to select that block 1202(m). The voltage Vss is applied to each block select transistor 1204 in other blocks (e.g., block 1202(0)), such that that other blocks are un-selected. Typically, there is one selected block and many unselected blocks. There may be one word line voltage transistor 1206(0)-1206(n) coupled to each word line. For example, transistor 1206(0) is coupled to WL0 of each block 1202 through one of the word line select transistors 1204. Likewise, transistor 1206(n) is coupled to WLn of each block 1202 through one of the word line select transistors 1204. Note that a given word line voltage transistor 1206 may be shared by different blocks. For example, if there are 64 word lines per block, there may be 64 word line voltage transistors 1206.

As depicted, block 1202(m) is selected for programming. Specifically, word line WLn in block 1202(m) is selected for programming. The rest of the word lines in block 1202(m) are not selected for programming. Only one of the unselected word lines (WL0) is depicted. None of the word lines in block 1202(0) are presently selected for programming.

Each of the word lines has a first end 1218 that is coupled to the block select transistor 1204 and a second end 1220 that is far from the block select transistor 1204. The word line also has an intermediate point 1222 between the first end 1218 and the second end 1220. The portion of the word line between the first end 1218 and the intermediate point 1222 is a first physical segment 1224. 1220. The portion of the word line between the intermediate point 1222 and the second end 1220 is a second physical segment 1226. Although the memory cells are not depicted in FIG. 12A, a first group of memory cells are associated with the first physical segment 1224, and a second group of memory cells are associated with the second physical segment 1226. The voltages are applied to the first end of the word line by block select transistor 1204. The block select transistor 1204 can also be referred to as a word line driver.

Suitable voltages for a program operation are being applied. A program voltage (Vpgm) is applied to word line voltage transistor 1206(n). The program voltage is passed to the first end of the selected word line (WLn) by the block select transistor 1204. Vpass is a boosting voltage that is applied to word line voltage transistor 1206(0). The boosting voltage Vpass gets passed to the unselected word line by its block select transistor 1204. The voltage Vpass may also be applied to other word line voltage transistors (not depicted in FIG. 12A) in order to apply Vpass to other un-selected word lines of the selected block 1202(m). Because Vss is applied to the block select transistors 1204 in the non-selected blocks, the voltages Vpgm and Vpass do not pass to the word lines in the un-selected blocks. Note that other configurations could be used to provide the voltages to the word lines.

Because there is some resistance and some capacitance associated with the word lines (both selected and un-selected), the voltages that are applied to the first end of the word lines takes some time to propagate to the far end of the word lines. Note that a word line may have many memory cells associated with it. For example, there may be thousands, tens of thousands or even more memory cells associated with a single word line. The memory cells along the entire selected word line may be programmed during a programming operation.

If the pulse width of the program voltage Vpgm is very long, relative to the RC time constant along the selected word line, then the program voltage Vpgm can quickly ramp up to its intended value at both the near and far ends of the selected word line (where a quick ramp up is relative to the pulse width). However, the RC time constant is not insignificant in many cases (at least with respect to the pulse width of the program voltage). In such cases, for the memory cells near the row decoder 530, the program voltage can ramps up relatively quickly. However, for memory cells far from the row decoder 530, the program voltage may ramp up more slowly.

This means that the memory cells near the decoder 530 can program faster than the memory cells far from the decoder 530. Thus, the threshold voltage of memory cells near the row decoder 530 may increase more with each program pulse than those far from the row decoder 530.

Figure 12B:
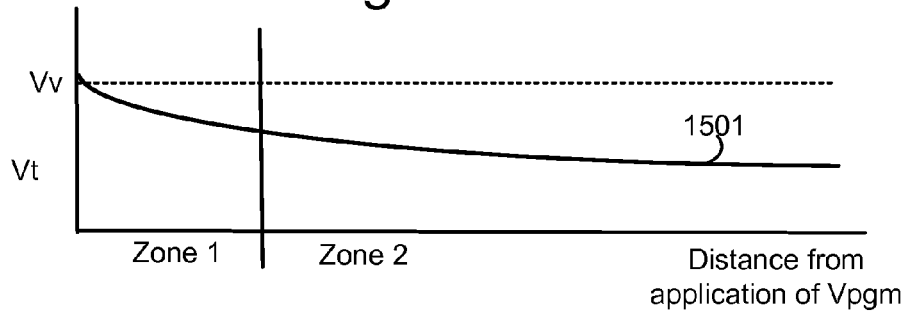
FIG. 12B is a representation of how the speed in which memory cells program may depend on their physical location along the word line.

FIG. 12B is a representation of how the speed in which memory cells program may depend on their physical location along the word line. The graph depicts memory cell threshold voltage (Vt) versus distance from the end of the word line at which the program voltage was applied. Curve 1501 is the threshold voltage after a few program pulses are applied. Curve 1501 shows that the memory cell threshold voltage is progressively lower with increasing distance from the physical location that Vpgm was applied to the word line. Note that memory cells physically close to the word line driver might reach the verify level (Vv) while those at the far end are still far below the verify level (Vv). In this example, two physical zone are depicted. Zone 1 is for memory cells that are in the physical segment of the word line that is closest to the word line driver, in this example. Zone 2 is for memory cells that are in the physical segment of the word line that is farther from the word line driver, in this example.

Since the faster/slower programming memory cells can be inferred based on their physical location relative to the row decoder 530 (or physical location at which Vpgm was applied), program verify can be skipped early in the programming process for the slower programming memory cells. For example, for the first few program loops program verify is only performed for memory cells that are close to the physical location at which Vpgm was applied to the word line. For later program loops program verify is performed for all of the memory cells. Note that when program verify is skipped for a memory cell, its NAND string can be prevented from conducting a significant current, regardless of the threshold voltage of the memory cell. This is referred to herein as "locking out" a NAND string.

The foregoing saves peak current consumption during program verify. Prior to programming, the memory cells are erased. Thus, if a program verify were to be performed just after erase, all of the memory cells should conduct a current. Similarly, if a program verify were to be performed right after the first programming pulse, most of the memory cells are still likely to conduct a current since most will still have a threshold voltage below the program verify level. Thus, there is the potential for a high current draw.

However, by only performing program verify on the memory cells near the row decoder 530 (or near the point Vpgm was applied to the word line) after the first program pulse (or first two, three, etc. program pulses), current consumption is saved. The reason is that the memory cells that are not being verified will not conduct a current regardless of their threshold voltage. Later in the programming process, all of the memory cells can be verified without resulting in a high current consumption. A reason for this is that as programming progresses more (or most) memory cells will have their threshold voltage above the program verify level, and hence not conduct a significant current. By, "as programming progresses" it is meant as more program loops are performed.

The foregoing is one example in which slower programming memory cells are not verified early in the programming process. In general, the memory cells that program more slowly are not necessarily those that are farthest from the row decoder 530. Depending on the architecture, memory cells at some other location along the word line might program more slowly.

Figure 13A:
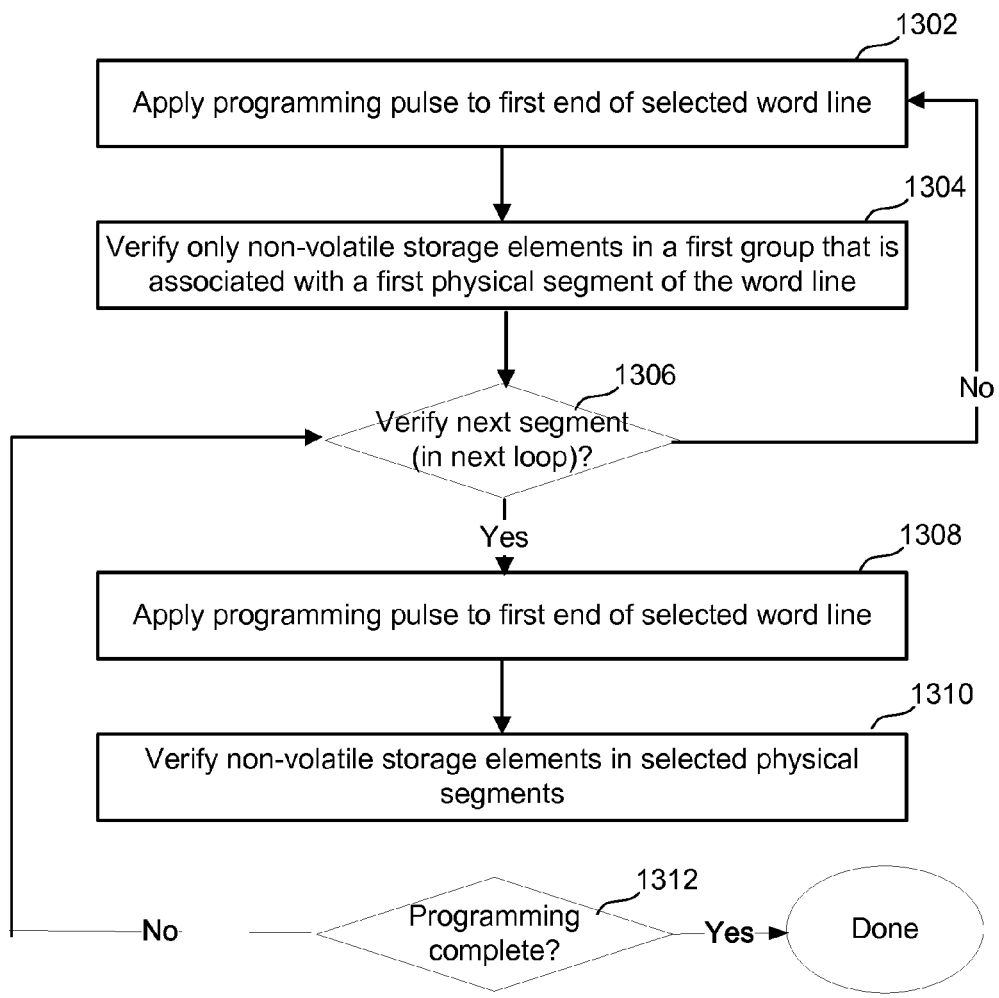
FIG. 13A is a flowchart of one embodiment of a process of applying a programming pulse and verifying memory cells during a programming operation.

FIG. 13A is a flowchart of one embodiment of a process of applying a programming pulse and verifying memory cells during a programming operation. In one embodiment, the process is performed in 2D NAND. In one embodiment, the process is performed in 3D NAND. The 3D NAND has vertically oriented NAND strings, in one embodiment. This process could be used when programming a single bit in each memory cell. This process could be used when programming multiple bits in each memory cell. In one embodiment, when programming multiple bits, there are at least two programming passes. FIGS. 7C and 7D provide one example of a two pass programming process. In that case, the process of FIG. 13A might be used to verify memory cells being programmed from the erased state 700 to the LM state 705. The process can also be used to verify memory cells being programmed from the erased state 700 to the A state 702, as well as those being programmed from the LM state 705 to the B-state 704 and C-state 706. Thus, note that the memory cells that are verified in the process of FIG. 13A may or may not be programmed to the same state. Further, note that the memory cells are not necessarily being programmed to their final state (as in the case of the LM state 705). Finally, the foregoing are just a few examples. The process of FIG. 13A may be used in many other programming sequences.

Step 1302 includes applying a programming pulse to a first end of a selected word line. In one embodiment, a word line driver 2208 applies a programming pulse to a word line driver end 2203 of the selected word line in a 3D NAND memory array (see, for example, FIGS. 10D, 10E). In one embodiment, a block select transistor connected 1204 applies a programming pulse to a first end 1218 of the selected word line in a 2D NAND memory array (see, for example, FIG. 12). Step 1302 is one embodiment of step 760 from the programming process of FIG. 7A.

In step 1304, only memory cells in a first physical segment of the selected word line are verified. FIG. 12 shows one example in which there are two physical segments 1224 and 1226 in a word line of a 2D NAND. FIG. 10D shows one example in which there are two physical segments 2282 and 2284 in a word line of a 3D NAND. FIG. 10E shows another example in which there are two physical segments 2382 and 2384 in a word line of a 3D NAND. There could be more than two physical segments for both the 2D and 3D NAND examples.

In one embodiment, the group of memory cells that are verified in step 1304 are in the physical segment that is closest to the end of the word line at which the programming pulse was applied. In one embodiment, the group of memory cells that are verified in step 1304 are in the physical segment that has memory cells that program the fastest. In some cases, the memory cells that are in the physical segment that is closest to the end of the word line at which the programming pulse was applied program the fastest. However, that is not necessarily always the case. In the event that memory cells in a different physical segment (e.g., one that is not closest to the word line driver) program fastest, then memory cells in that fast programming physical segment are verified in step 1304.

Note that memory cells in other physical segments are not verified in step 1304. This saves peak current and/or power consumption. In one embodiment, those memory cells that are not program verified have their NAND strings locked out (e.g., prevented from conducting a current).

In one embodiment, step 1304 includes applying one or more program verify reference voltages to the selected word line. As one example, the voltage VvLM is applied to verify memory cells being programmed to the LM state 705 (see FIG. 7C). As another example, several program verify voltages are applied to the selected word line, in succession. For example, first Vva is applied, then this is increased to VvB, and then increased to Vvc. Thus, memory cells being programmed to the A state 702, the B-state 704, and the C-state 706 may be verified in step 1304 (see FIG. 7D). As another example, any subset of the A state 702, the B-state 704, and the C-state 706 might be verified. In one embodiment, the memory cells are being programmed to a single bit per memory cell. Other possibilities exist.

Step 1304 is one embodiment of step 762 from the programming process of FIG. 7A. Recall that steps 760 and 762 occur in each program loop of the process of FIG. 7A. Since not all of the memory cells have been verified, this means that not all of the memory cells have passed verify at this point in the process of FIG. 13A. Thus, another program loop will be performed.

In step 1306, the management circuitry determines whether memory cells in an additional physical segment of the selected word line should be verified in the next program loop. If not (step 1306=no), then the process returns to step 1302. Note that the program pulse could be stepped up for the next program loop.

If step 1306=yes, then the management circuitry determines that memory cells in an additional physical segment of the word line should be verified. As one example, the memory cells associated with both the first and second physical segments (see FIGS. 10D, 10E, 12, for examples) are selected for program verify. In this case, this is memory cells along the entire selected word line. However, there could be more than two physical segments. Note that the determination of when to add additional physical segments to those being verified can be based on expectations of how fast memory cells in the respective physical segments will program.

In step 1308, a programming pulse is applied to the selected word line. This step is similar to step 1302.

In step 1310, memory cells in the selected physical segments are verified as to whether they have been programmed to their respective intended states. Step 1310 may be similar to step 1304.

Step 1312 then determines whether programming is complete. This has been discussed with respect to steps 764-771 of FIG. 7A. If not, the program pulse may be incremented (see step 772 in FIG. 7A). Then, the process returns to step 1306 to determine whether an additional memory cells in an physical segment of the selected word line should be program verified in the next program loop.

Processing continues until all (or most) memory cells passed program verify. By the end of the process, memory cells in all of the physical segments should be verified in step 1310.

Figure 13B:
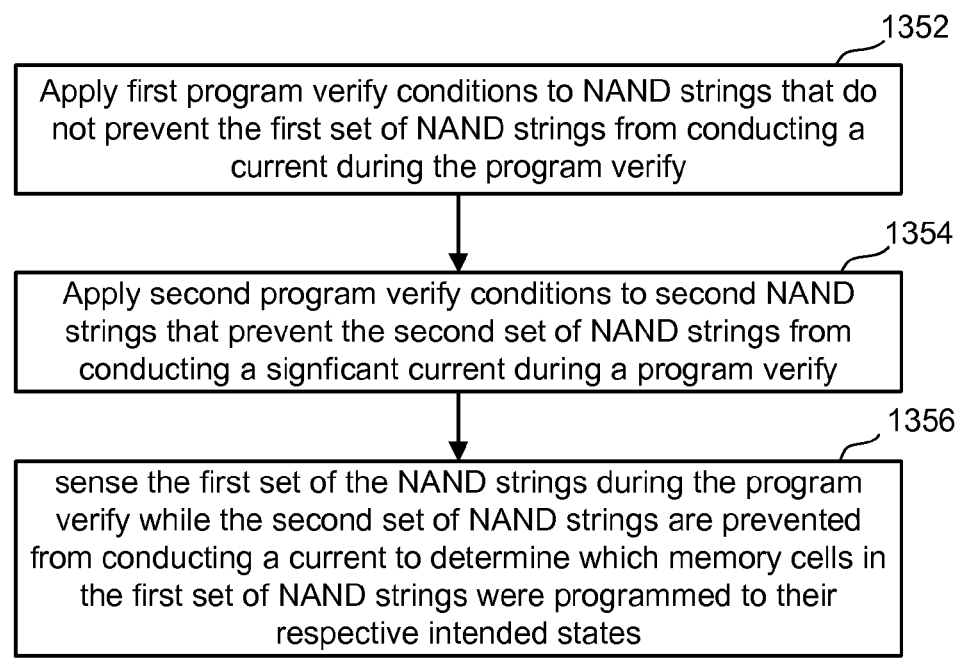
FIG. 13B is a flowchart of one embodiment of applying program verify conditions.

FIG. 13B is a flowchart of one embodiment of applying program verify conditions. The process applies conditions to the NAND strings depending on which physical segment of the word line the given NAND string (or the given memory cell) is in. NAND strings in a physical segment having faster programming memory cells may be allowed to conduct a current for early program loops. This allows those memory cells to be program verified. However, NAND strings in a physical segment having slower programming memory cells might be locked out (prevented from conducting a current) for early program loops. Those memory cells are not program verified for the early program loops. The process helps to save current and/or power by preventing some NAND strings from conducting a significant current (during at least some program loops) regardless of the state (e.g., threshold voltage) of the selected memory cell on the given NAND string. Late in the program verify process, it is expected that most of the memory cells will pass program verify. By "late in the program verify process" it is meant for later program loops. A memory cell that passes program verify does not conduct a significant current (its threshold voltage is above the program verify reference level). Therefore, late in the program verify process, current consumption might not be as much of a problem. This process can be used for step 1304, as well as step 1310 of FIG. 13A.

In step 1352, the system (e.g., managing circuitry) applies first program verify conditions to the NAND strings associated with physical segments associated with memory cells to be verified. The first verify conditions allow a given NAND string to conduct a current during a program verify operation. Note that a given NAND string may or may not conduct a current, depending on whether its selected memory cell passes program verify. In other words, the amount of current the NAND string conducts may depend on the threshold voltage of its selected memory cell.

In step 1354, the system applies second verify conditions to NAND associated with physical segments associated with memory cells not to be verified. The second verify conditions prevent a given NAND string from conducting a current during the program verify operation regardless of the state of the memory cell. This may be referred to a "locking out" a NAND string.

In step 1356, the NAND strings associated with the physical segments to be verified are sensed during the program verify operation while the other NAND strings are prevented from conducting a current (e.g., are locked out). Thus, the system determines which of the selected memory cells associated with the selected physical segment were programmed to the target reference level.

Figure 14:
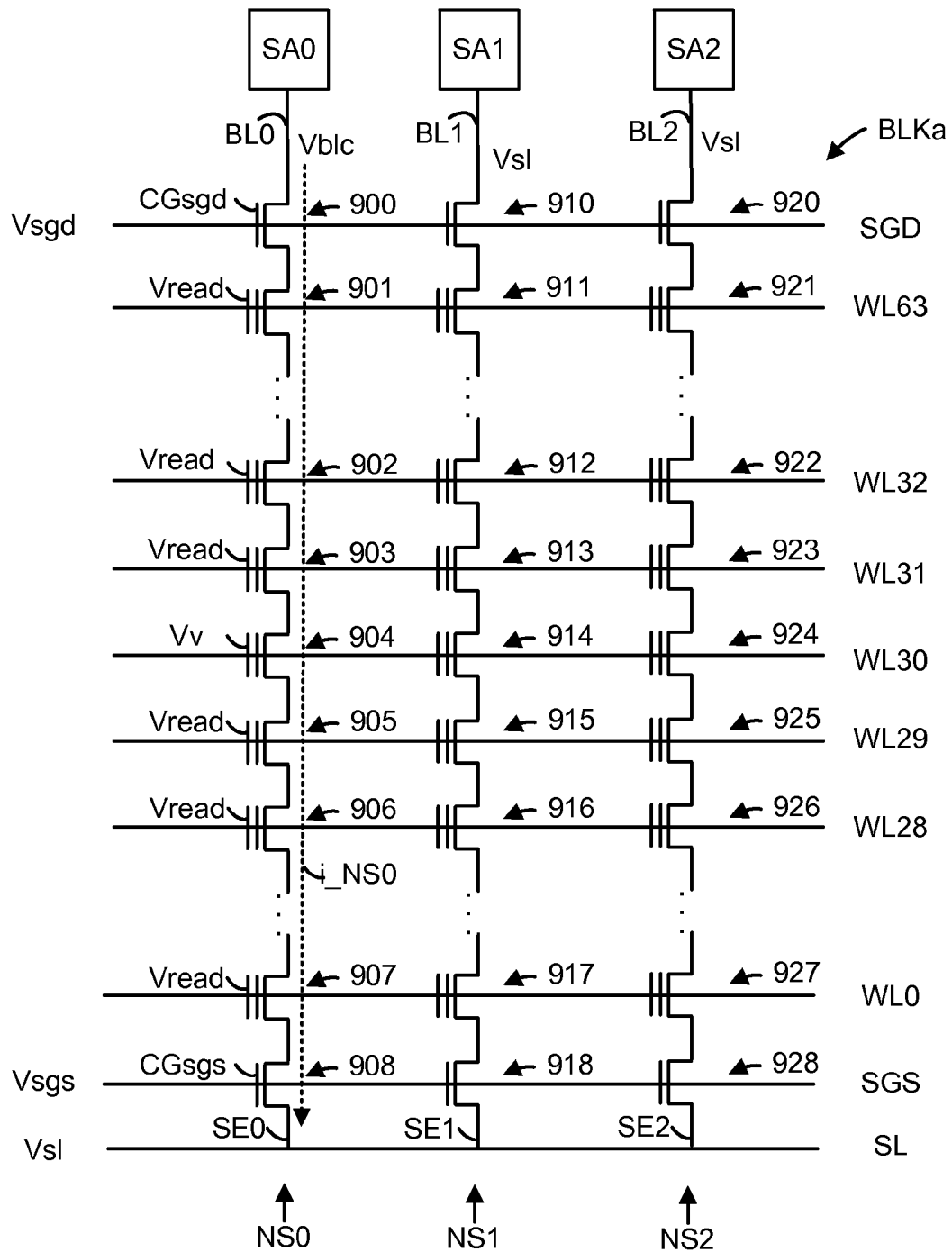
FIG. 14 depicts conditions for one embodiment of setting up conditions for reducing current and/or power during program verify.

FIG. 14 depicts conditions for one embodiment of setting up conditions for reducing current and/or power during program verify. FIG. 14 shows signals applied to word lines, bit lines, and a common source line to program verify a memory cell on one NAND string while not program verifying a memory cell on another NAND string. The voltage Vv is applied to the selected word line. This is the program verify reference voltage. Example program verify reference voltages are depicted in FIGS. 7C and 7D, but those are just several examples. The voltage Vread is applied to each of the unselected word lines. This is a pass voltage that should be higher than the threshold voltage of any of the memory cells.

NAND string NS0 is allowed to conduct a current, depending on the threshold voltage of its selected memory cell (cell 904). Note that Vblc is applied to its bit line BL0. Also note that Vblc is greater than Vsl, which is applied to the common source line (SL). Thus, a current could flow through NAND string NS0 from the bit line BL0 to the source line (SL).

NAND strings NS1 and NS2 are prevented from conducting a current ("locked out"). The same voltage is applied to locked out bit lines as is applied to the common source line (e.g., Vsl). Thus, Vsl is applied to bit lines BL1 and BL2, which are locked out because of the location of these NAND strings relative to the physical segment being verified. Note that no current is depicted as passing through those locked out NAND strings. However, current i_NS0 is depicted as passing through NAND string NS0. This refers to the current that potentially flows through NS0, depending on whether the memory cells turn on in response to the control gate voltage.

Applying the voltages to the bit lines may be achieved by charging the bit lines using circuitry in the sense block 500. Thus, the managing circuit could apply a first voltage (e.g., Vsl) to the common source line, charge the first set of bit lines to the first voltage (e.g., Vsl), and charge the second set of bit lines to a second voltage (e.g., Vblc) that is greater than the first voltage applied to the common source line.

Figure 15A:
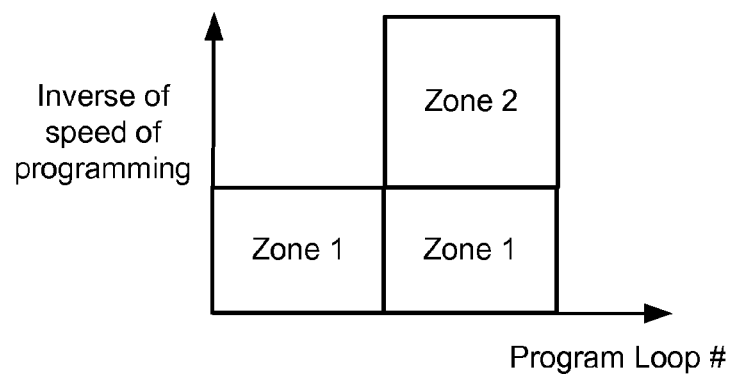
FIGS. 15A-15D depict examples of different ways in which the word line can be physically segmented, with respect to when program verify is performed.
Figure 15B:
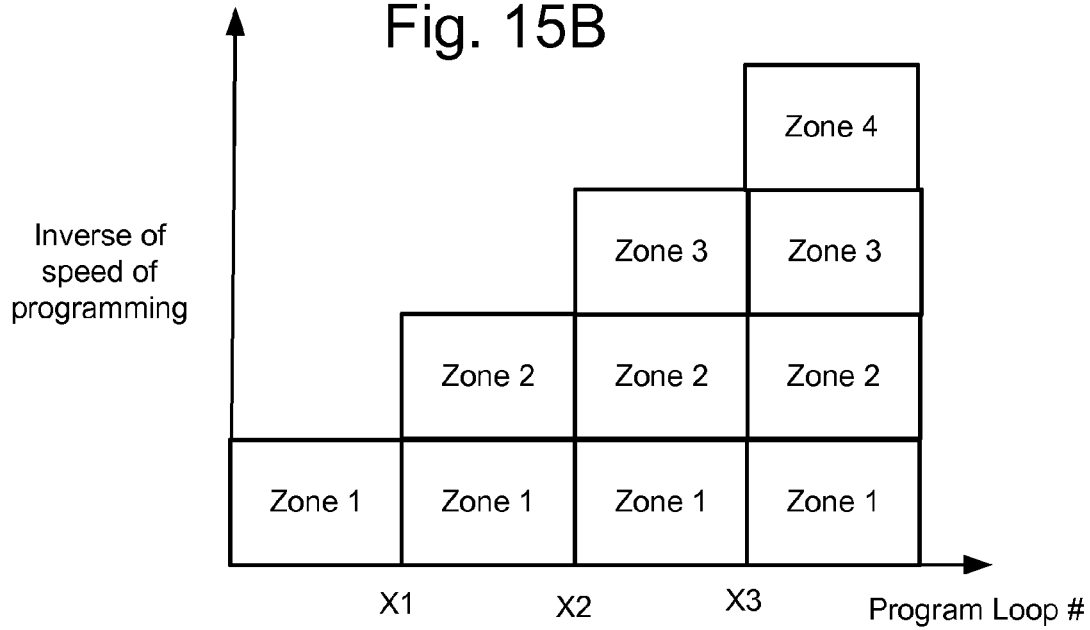
Figure 15C:
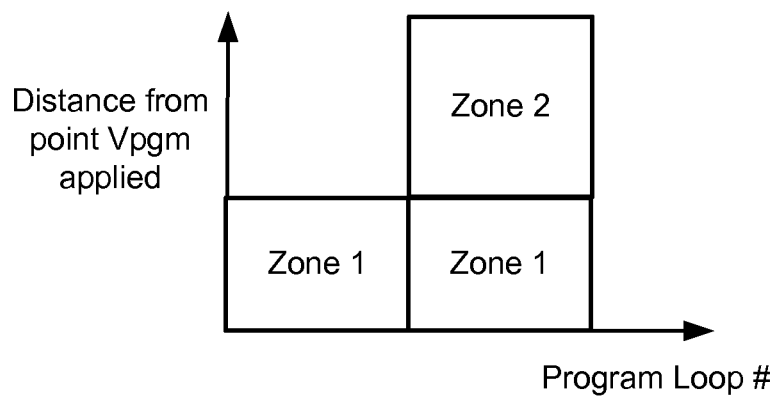

FIGS. 15A-15D depict examples of different ways in which the word line can be physically segmented, with respect to when program verify is performed. In FIGS. 15A-15B, the x-axis refers to the program loop number. The y-axis refers to the inverse of the programming speed. In FIG. 15A, the word line is divided into two physical segments, which are referred to as Zone 1 and Zone 2. Zone 1 is for the fastest programming memory cells. Zone 1 could correspond to the physical segment closest to the word line driver, but that is not a requirement. The diagram shows that for early program loops, only those memory cells in Zone 1 are program verified. For later program loops, memory cells in both Zone 1 and Zone 2 are program verified. Note that Zone 1 and Zone 2 together covers that entire word line in this example.

In FIG. 15B, the word line is divided into four physical segments, which are referred to as Zones 1-Zone 4. Zone 1 is for the fastest programming memory cells. Zones 2, 3, and 4 are for progressively slower programming memory cells. Zone 1 could correspond to the physical segment closest to the word line driver, but that is not a requirement. The diagram shows that for program loops up to "X1", only those memory cells in Zone 1 are program verified. For program loops after X1 up until X2, only those memory cells in Zone 1 and Zone 2 are program verified. For program loops after X2 up until X3, only those memory cells in Zone 1 and Zone 2 and Zone 3 are program verified. For program loops after X3, memory cells in all Zones program verified. Note that Zones 1 to Zone 4 together covers that entire word line in this example.

In one embodiment, all of the memory cells in a given zone are physically contiguous. That is, memory cells in a given zone represent those in a continuous physical segment of the word line, in one embodiment. However, note that the physical segment of the fastest programming memory cells could be anywhere on the word line. Thus, the fastest programming memory cells are not required to be closest to the word line driver.

In FIGS. 15C-15D, the x-axis again refers to the program loop number. However, the y-axis refers to the distance from which the programming voltage was applied to the selected word line. In FIG. 15B, the word line is divided into two physical segments, which are referred to as Zone 1 and Zone 2. Zone 1 is for the memory cells closest to the point Vpgm was applied. The diagram shows that for early program loops, only those memory cells in Zone 1 are program verified. For later program loops, memory cells in both Zone 1 and Zone 2 are program verified. Note that Zone 1 and Zone 2 together covers that entire word line in this example.

Figure 15D:
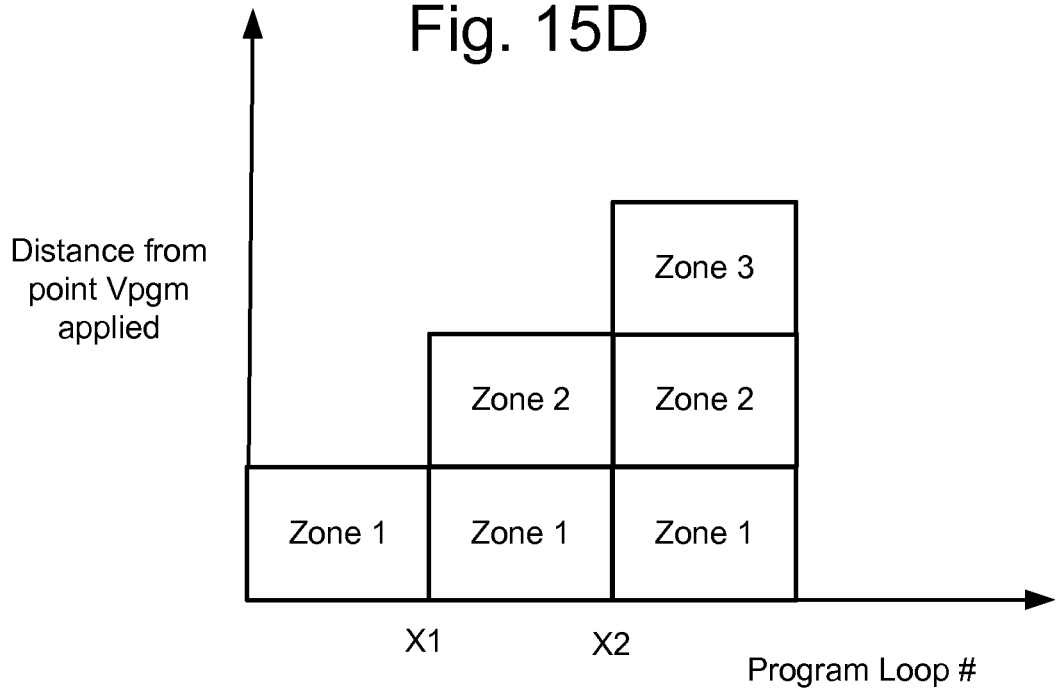

In FIG. 15D, the word line is divided into four physical segments, which are referred to as Zones 1-Zone 3. Zone 1 is for memory cells closest to the point Vpgm was applied. Zones 2 and 3 are for memory cells progressively farther from the point Vpgm was applied. The diagram shows that for program loops up to "X1", only those memory cells in Zone 1 are program verified. For program loops after X1 up until X2, only those memory cells in Zone 1 and Zone 2 are program verified. For program loops after X2, memory cells in all Zones program verified. Note that Zones 1 to Zone 3 together covers that entire word line in this example.

Note that in one embodiment of the scheme of FIG. 15D, Zone 1 has the fastest programming memory cells, Zone 2 has the next fastest programming memory cells, Zone 3 has the slowest programming memory cells. The point on the word line that divides Zone 1 and Zone 2 may be referred to as a first intermediate point. The point on the word line that divides Zone 2 and Zone 3 may be referred to as a second intermediate point. In one embodiment, the managing circuitry verifies only those non-volatile storage elements between the first end of the selected word line and the first intermediate point in the first "n" program loops. The managing circuitry verifies only those non-volatile storage elements between the first end and the second intermediate point in program loops "n+1" to "n+1+m," wherein "n" and "m" are positive integers. The managing circuitry verifies all non-volatile storage elements between the first end and the second end for remaining program loops.

One embodiment disclosed herein includes a method of operating non-volatile storage, which comprising the following. Erase conditions are applied to a group of NAND strings of non-volatile storage elements. A first set of NAND strings in the group that were erased to a strict reference level and a second set of NAND strings in the group that were not erased to the strict reference level are identified. The strict reference level is lower than a target reference level to which the group of NAND strings are to be erased. First verify conditions are applied to the first set of the NAND strings that prevent the first set of NAND strings from conducting a substantial current during an erase verify. Second verify conditions are applied to the second set of NAND strings that do not prevent the second set of NAND strings from conducting a current during the erase verify. The second set of NAND strings are sensed during the erase verify while the first set of NAND strings are prevented from conducting a current to determine which of the second set of NAND strings were erased to the target reference level.

One embodiment disclosed herein includes a non-volatile storage device comprising a plurality of NAND strings having non-volatile storage elements, a plurality of bit lines, and managing circuitry in communication with the plurality of NAND strings and the plurality of bit lines. Each of the NAND strings is associated with a bit line of the plurality of bit lines. The managing circuitry is configured to apply an erase signal to a group of the plurality of NAND strings. The managing circuitry is configured to sense the group of NAND strings at a strict reference level after applying the erase signal. The strict reference level is lower than a target reference level to which the group of the plurality of NAND strings are to be erased. The managing circuitry is configured to determine a first set of the group of NAND strings that were erased to the strict reference level and a second set of the NAND strings were not erased to the strict reference level. The managing circuitry is configured to apply first verify conditions to the first set of the NAND strings that prevents the first set of NAND strings from conducting a substantial current during an erase verify. The managing circuitry is configured to apply second verify conditions to the second set of the NAND strings that does not prevent the second set of NAND strings from conducting a current during the erase verify. The managing circuitry is configured to sense the second set of the NAND strings during the erase verify while the first set of NAND strings are prevented from conducting a current to determine which of the second set of NAND strings were erased to the target reference level.

One embodiment disclosed herein includes a 3D non-volatile storage device comprising a substrate, a plurality of word lines layers above the substrate, a plurality of insulator layers alternating with the word line layers in a stack above the substrate, a plurality of bit lines, a plurality of non-volatile storage element strings above the substrate, and managing circuitry. Each of the word line layers comprises one or more word lines. Each non-volatile storage element string comprises a plurality of non-volatile storage elements. Each of the non-volatile storage elements is associated with a word line in the word line layers. Each of the plurality of non-volatile storage element strings is associated with a bit line of the plurality of bit lines. The managing circuitry is in communication with plurality of bit lines and the word lines in the word line layers. The managing circuitry applies erase conditions to a group of the plurality of non-volatile storage element strings. The managing circuitry determines a first set of the strings that were erased to a strict reference level and a second set of the strings were not erased to the strict reference level as a result of the erase conditions. The strict reference is a deeper erase than a target reference level to which the group of strings is being erased. The managing circuitry applies first erase verify conditions to the first set of the strings that prevents the first set of strings from conducting a substantial current during erase verify. The managing circuitry applies second erase verify conditions to the second set of the strings that allows the second set of strings to conduct a current during the erase verify. The managing circuitry senses the second set of the strings during the erase verify while the first set of strings are prevented from conducting a current to determine which of the second set of strings were erased to the target reference level.

One embodiment includes a non-volatile storage device comprising a plurality of NAND strings having non-volatile storage elements, a plurality of bit lines, a plurality of word lines associated with the plurality of NAND strings, and managing circuitry in communication with the plurality of bit lines and the plurality of word lines. Each of the NAND strings is associated with a bit line of the plurality of bit lines. Each of the word lines having a first physical segment and a second physical segment. The managing circuitry is configured to apply a first programming pulse to a first end of a selected word line. The managing circuitry is configured to verify whether non-volatile storage elements associated with the first physical segment of the selected word line are programmed to their respective intended state without verifying whether any of the non-volatile storage elements associated with the second physical segment of the selected word line are programmed to their respective intended state as a result of applying the first programming pulse. The managing circuitry is configured to apply a second programming pulse to the first end of the selected word line after verifying whether only non-volatile storage elements associated with the first physical segment of the selected word line are programmed to their respective intended state. The managing circuitry is configured to verify whether non-volatile storage elements associated with both the first physical segment and the second physical segment of the selected word line are programmed to their respective intended state as a result of applying the second programming pulse.

In one embodiment, each of the word lines of the device of the previous paragraph has a second end that is opposite the first end and an intermediate point between the first end and the second end. The first physical segment extends from the first end to the intermediate point. The second physical segment extends from the intermediate point to the second end.

In one embodiment, in the device of either of the two previous paragraphs non-volatile storage elements associated with the first physical segment of the selected word line program faster than the non-volatile storage elements associated with the second physical segment of the selected word line.

One embodiment includes a method of operating non-volatile storage comprising the following. A first programming pulse is applied to a first end of a word line that is associated with a plurality of non-volatile storage elements. The plurality of non-volatile storage elements comprises a first group associated with a first physical segment of the word line and a second group associated with a second physical segment of the word line. Verifying whether non-volatile storage elements in the first group of non-volatile storage elements are programmed is performed without verifying whether any of the non-volatile storage elements in the second group are programmed as a result of applying the first programming pulse. A second programming pulse is applied to the first end of the word line after verifying whether non-volatile storage elements in the first group of non-volatile storage elements are programmed as a result of applying the first programming pulse. Verifying whether non-volatile storage elements in both the first group and the second group are programmed as a result of applying the second programming pulse is performed.

One embodiment includes a three-dimensional (3D) non-volatile storage device comprising a substrate, a plurality of vertically oriented NAND strings having non-volatile storage elements above the substrate, a plurality of bit lines, a plurality of horizontal word lines associated with the plurality of NAND strings, and managing circuitry in communication with the plurality of bit lines and the plurality of word lines. Each of the NAND strings is associated with a bit line of the plurality of bit lines. Each of the word lines has a first end, a second end at the opposite side end of the word line as the first end, and an intermediate point between the first end and the second end. The managing circuitry performs a programming process having a plurality of program loops. In each program loop, the managing circuitry applies a program pulse to the first end of a selected word line followed by a verify operation. The managing circuitry verifies only those non-volatile storage elements between the first end and the intermediate point of the selected word line in an initial program loop. The managing circuitry verifies all non-volatile storage elements between the first end and the second end of the selected word line in a program loop in at least one program loop after the initial program loop.

Techniques for erasing with an erase verify that reduces peak current and/or power consumption can be applied to a variety of types of memory cells, such as those having floating gates, as well as charge storage regions (e.g., ONO). Also, techniques for erasing with an erase verify that reduces peak current and/or power consumption can be applied to a 2D architecture, as well as a 3D architecture, such as 3D NAND. 3D NAND may have vertically-oriented NAND strings that reside above a substrate. Examples discussed above are not intended to limit the invention to the precise form disclosed.

Techniques for programming with a program verify that reduces peak current and/or power consumption can be applied to a variety of types of memory cells, such as those having floating gates, as well as charge storage regions (e.g., ONO). Also, techniques for programming with a program verify that reduces peak current and/or power consumption can be applied to a 2D architecture, as well as a 3D architecture, such as 3D NAND. 3D NAND may have vertically-oriented NAND strings that reside above a substrate. Examples discussed above are not intended to limit the invention to the precise form disclosed.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage device comprising:
a plurality of NAND strings having non-volatile storage elements;
a plurality of bit lines, each of the NAND strings is associated with a bit line of the plurality of bit lines; and
managing circuitry in communication with the plurality of NAND strings and the plurality of bit lines, the managing circuitry is configured to apply an erase signal to a group of the plurality of NAND strings, the managing circuitry is configured to sense the group of NAND strings at a strict reference level after applying the erase signal, the strict reference level is lower than a target reference level to which the group of the plurality of NAND strings are to be erased, the managing circuitry is configured to determine a first set of the group of NAND strings that were erased to the strict reference level and a second set of the NAND strings were not erased to the strict reference level, the managing circuitry is configured to apply first verify conditions to the first set of the NAND strings that prevents the first set of NAND strings from conducting a substantial current during an erase verify, the managing circuitry is configured to apply second verify conditions to the second set of the NAND strings that does not prevent the second set of NAND strings from conducting a current during the erase verify, the managing circuitry is configured to sense the second set of the NAND strings during the erase verify while the first set of NAND strings are prevented from conducting a current to determine which of the second set of NAND strings were erased to the target reference level.

2. The non-volatile storage device of claim 1, wherein the managing circuitry is configured to sense the second set of the NAND strings during the erase verify after the managing circuitry determines the first set of NAND strings that were erased to the strict reference level and the second set of NAND strings that were not erased to the strict reference level without the managing circuitry applying additional erase conditions to the group of NAND strings.

3. The non-volatile storage device of claim 1, wherein the managing circuitry is further configured to:
apply erase conditions to the group of NAND strings a plurality of times prior to determining the first set of NAND strings that were erased to the strict reference level and the second set of NAND strings that were not erased to the strict reference level.

4. The non-volatile storage device of claim 1, wherein the managing circuitry is further configured to:
apply erase conditions to the group of NAND strings an additional time if erasure of the group of NAND strings to the target reference level is not complete after determining which of the second set of NAND strings were erased to the target reference level; and
repeat the determining, the applying first verify conditions, the applying second verify conditions, the sensing, and applying erase conditions until the erasure of the group of NAND strings to the target reference level is complete.

5. The non-volatile storage device of claim 1, wherein the managing circuitry is further configured to:
apply erase conditions between determining the first set of NAND strings that were erased to the strict reference level and the second set of NAND strings that were not erased to the strict reference level and sensing the second set of the NAND strings during the erase verify.

6. The non-volatile storage device of claim 1, wherein the first set of the NAND strings are associated with a first set of the plurality of bit lines, the second set of the NAND strings are associated with a second set of the plurality of bit lines, a common source line is associated with the group of NAND strings, wherein the managing circuitry being configured to apply first verify conditions and apply second verify conditions comprises the managing circuitry being configured to:
apply a first voltage to the common source line;
charge the first set of bit lines to the first voltage that is applied to the common source line; and
charge the second set of bit lines to a second voltage that is greater than the first voltage applied to the common source line.

7. The non-volatile storage device of claim 1, further comprising a three dimensional memory array, the plurality of NAND strings are vertical NAND strings in the three dimensional memory array.

8. The non-volatile storage device of claim 1, wherein the non-volatile storage elements comprise non-conductive charge trapping regions that store information.

9. A 3D non-volatile storage device comprising:
a substrate;
a plurality of word lines layers above the substrate, each of the word line layers comprises one or more word lines;
a plurality of insulator layers alternating with the word line layers in a stack above the substrate;
a plurality of bit lines;
a plurality of non-volatile storage element strings above the substrate, each non-volatile storage element string comprises a plurality of non-volatile storage elements, each of the non-volatile storage elements is associated with a word line in the word line layers, each of the plurality of non-volatile storage element strings is associated with a bit line of the plurality of bit lines; and
managing circuitry in communication with plurality of bit lines and the word lines in the word line layers, the managing circuitry applies erase conditions to a group of the plurality of non-volatile storage element strings, the managing circuitry determines a first set of the non-volatile storage element strings that were erased to a strict reference level and a second set of the non-volatile storage element strings were not erased to the strict reference level as a result of the erase conditions, the strict reference is a deeper erase than a target reference level to which the group of strings is being erased, the managing circuitry applies first erase verify conditions to the first set of the strings that prevents the first set of strings from conducting a substantial current during erase verify, the managing circuitry applies second erase verify conditions to the second set of the strings that allows the second set of strings to conduct a current during the erase verify, the managing circuitry senses the second set of the strings during the erase verify while the first set of strings are prevented from conducting a current to determine which of the second set of strings were erased to the target reference level.

10. The 3D non-volatile storage device of claim 9, wherein the managing circuitry senses the second set of strings during the erase verify after determining the first set of strings that were erased to the strict reference level and the second set of strings that were not erased to the strict reference level without application of additional erase conditions to the group of strings.

11. The 3D non-volatile storage device of claim 9, wherein the managing circuitry:
applies erase conditions to the group of strings a plurality of times prior to determining the first set of strings that were erased to the strict reference level and the second set of strings that were not erased to the strict reference level.

12. The 3D non-volatile storage device of claim 9, wherein the first set of the strings are associated with a first set of the plurality of bit lines, the second set of the strings are associated with a second set of the plurality of bit lines, a common source line is associated with the group of strings, wherein when the managing circuitry applies first erase verify conditions and applies second erase verify conditions the managing circuitry:
charges the first set of bit lines to a voltage that is equal to a voltage applied to the common source line; and
charges the second set of bit lines to a voltage that is greater than the voltage applied to the common source line.

13. The 3D non-volatile storage device of claim 9, wherein the plurality of non-volatile storage element strings are vertically oriented NAND strings.

14. A method of operating non-volatile storage, the method comprising:
- applying erase conditions to a group of NAND strings of non-volatile storage elements;
- determining a first set of NAND strings in the group of NAND strings that were erased to a strict reference level and a second set of NAND strings in the group that were not erased to the strict reference level, the strict reference level is lower than a target reference level to which the group of NAND strings are to be erased;
- applying first verify conditions to the first set of the NAND strings that prevent the first set of NAND strings from conducting a substantial current during an erase verify;
- applying second verify conditions to the second set of the NAND strings that do not prevent the second set of NAND strings from conducting a current during the erase verify; and
- sensing the second set of the NAND strings during the erase verify while the first set of NAND strings are prevented from conducting a current to determine which of the second set of NAND strings were erased to the target reference level.

15. The method of claim 14, wherein the sensing the second set of the NAND strings during the erase verify while the first set of NAND strings are prevented from conducting a current is performed after determining the first set of NAND strings that were erased to the strict reference level and the second set of NAND strings that were not erased to the strict reference level without application of additional erase conditions to the group of NAND strings.

16. The method of claim 14, further comprising:
- applying erase conditions to the group of NAND strings a plurality of times prior to performing an erase verification of the group of NAND strings at the target reference level.

17. The method of claim 14, further comprising:
- applying erase conditions to the group of NAND strings an additional time if erasure of the group of NAND strings is not complete after determining which of the second set of NAND strings were erased to the target reference level;
- repeating the determining, the applying first verify conditions, the applying second verify conditions, the sensing, and applying erase conditions until erasure of the group of NAND strings to the target reference level is complete.

18. The method of claim 14, further comprising:
- applying erase conditions between the determining the first set of NAND strings that were erased to the strict reference level and the second set of NAND strings that were not erased to the strict reference level and the sensing the second set of the NAND strings during the erase verify.

19. The method of claim 14, wherein the first set of the NAND strings are associated with a first set of bit lines, the second set of the NAND strings are associated with a second set of bit lines, a common source line is associated with the group of NAND strings, wherein the applying first verify conditions and the applying second verify conditions comprise:
- applying a first voltage to the common source line;
- charging the first set of bit lines to the first voltage; and
- charging the second set of bit lines to a second voltage that is greater than the first voltage applied to the common source line.

20. The method of claim 14, wherein the group of NAND strings are vertical NAND strings in a three dimensional memory array.

* * * * *